US007871698B2

(12) United States Patent
Ono et al.

(10) Patent No.: US 7,871,698 B2
(45) Date of Patent: Jan. 18, 2011

(54) ADHESIVE FILM, FLEXIBLE METAL-CLAD LAMINATE, AND PROCESSES FOR PRODUCING THESE

(75) Inventors: Kazuhiro Ono, Otsu (JP); Kan Fujihara, Otsu (JP); Takaaki Matsuwaki, Shizuoka (JP)

(73) Assignee: Kaneka Corporation, Osaka-shi (JP)

( * ) Notice: Subject to any disclaimer, the term of this patent is extended or adjusted under 35 U.S.C. 154(b) by 1054 days.

(21) Appl. No.: 11/568,689

(22) PCT Filed: Apr. 26, 2005

(86) PCT No.: PCT/JP2005/007875

§ 371 (c)(1),
(2), (4) Date: Nov. 3, 2006

(87) PCT Pub. No.: WO2005/111164

PCT Pub. Date: Nov. 24, 2005

(65) Prior Publication Data

US 2007/0218277 A1    Sep. 20, 2007

(30) Foreign Application Priority Data

| May 13, 2004 | (JP) | ............................ 2004-144107 |
| Jul. 15, 2004 | (JP) | ............................ 2004-209104 |
| Jul. 15, 2004 | (JP) | ............................ 2004-209113 |

(51) Int. Cl.
*B32B 7/12* (2006.01)
*C08G 73/10* (2006.01)

(52) U.S. Cl. .............................. 428/355 R; 428/473.5; 428/458; 528/353; 528/310; 427/207.1; 427/404

(58) Field of Classification Search ............. 428/355 R, 428/473.5, 458; 528/353, 310; 427/207.1, 427/404

See application file for complete search history.

(56) References Cited

U.S. PATENT DOCUMENTS 6,350,844 B1    2/2002    Ono et al.

FOREIGN PATENT DOCUMENTS

JP    4-162491 A    6/1992

(Continued)

OTHER PUBLICATIONS

Notification of Transmittal of Translation of the International Preliminary Report on Patentability (Form PCT/IB/338) of International Application No. PCT/JP2005/007875 mailed Nov. 23, 2006 with Forms PCT/IB/373 and PCT/ISA/237.
International Search Report of PCT/JP2005/007875, date of mailing Aug. 9, 2005.

*Primary Examiner*—Thao T. Tran
(74) *Attorney, Agent, or Firm*—Westerman, Hattori, Daniels & Adrian, LLP

(57) ABSTRACT

The present invention relates to an adhesive film with which a flexible metal-clad laminate is obtained with suppressed dimensional changes occurred when produced by a laminating method; and a flexible metal-clad laminate comprising the adhesive film and a metal foil bonded thereto. The adhesive film comprises a polyimide film and, formed on at least one side thereof, an adhesive layer comprising a thermoplastic polyimide and has coefficients of linear expansion satisfying the relationship 1.0>(coefficient of linear expansion in the MD direction)/(coefficient of linear expansion in the TD direction)>0.1. This adhesive film may be one produced continuously and further satisfying the relationship 1.70>(elastic modulus in the MD direction)/(elastic modulus in the TD direction)>1.05 when the adhesive film has an MD modulus of 5 GPa or higher throughout the whole width thereof. That adhesive film may be one produced continuously and further satisfying the relationship 2.00>(elastic modulus in the MD direction)/(elastic modulus in the TD direction)>1.10 when the adhesive film has an MD modulus less than 5 GPa throughout the whole thereof.

20 Claims, 5 Drawing Sheets

U.S. PATENT DOCUMENTS

| | | |
|---|---|---|
| JP | 2001-078781 | 3/2001 |
| JP | 2001-139807 | 5/2001 |
| JP | 2002-210903 | 7/2002 |
| JP | 2002-316386 | 10/2002 |
| JP | 2002-317159 | 10/2002 |
| JP | 2002-321300 | 11/2002 |
| JP | 2004-338160 | 12/2004 |
| JP | 2005-178242 | 7/2005 |
| JP | 2005-186574 | 7/2005 |
| JP | 2005-193542 | 7/2005 |

ADHESIVE FILM, FLEXIBLE METAL-CLAD LAMINATE, AND PROCESSES FOR PRODUCING THESE

TECHNICAL FIELD

The present invention relates to an adhesive film including a polyimide film having adhesive layer containing a thermoplastic polyimide, a flexible metal-clad laminate including the adhesive film bonded to a metal foil, and methods for producing the adhesive film and the flexible metal-clad laminate.

BACKGROUND ART

The recent trends toward lighter, smaller, and higher-density electronic devices have increased the demands for various printed circuit boards. In particular, the demands for flexible laminates (also referred to as "flexible printed circuit boards (FPC)") are showing a notable increase.

The flexible laminate includes an insulating film on which a circuit made from a metal foil is formed. The flexible laminate is generally produced by laminating and pressing with heat a metal foil onto a substrate thorough an adhesive material, the substrate being a flexible insulating film composed of an insulating material.

A polyimide film or the like is preferred for the insulating film application.

A thermosetting adhesive, such as an epoxy or acrylic adhesive, is typically used as the adhesive material. (An FPC prepared using the thermosetting adhesive is hereinafter also referred to as a "three-layer FPC".)

An advantage of the thermosetting adhesive is that bonding at relatively low temperature is possible. However, the requirements for various characteristics, such as heat resistance, flexibility, and electrical reliability, are becoming more and more stringent. It is possible to say that the three-layer FPC using the thermosetting adhesive may not be able to meet these stringent requirements.

To overcome this problem, an FPC prepared by directly laminating a metal layer onto an insulating film (polyimide film) or by using a thermoplastic polyimide in the adhesive layer has been proposed. Hereinafter, this type of FPC is also referred to as "two-layer FPC". Two-layer FPC have property superior to those of three-layer FPC and the demands therefor are expected to grow in the future.

Examples of methods for making flexible metal-clad laminates for use in two-layer FPC include a casting method in which a polyamic acid, i.e., a precursor of polyimide, is flow-cast onto a metal foil, followed by imidization; a metallizing method in which a metal layer is directly formed on a polyimide film by sputtering, plating, or the like; and a lamination method in which a thermoplastic polyimide is used to bond a metal foil onto a polyimide film.

Among these methods, the lamination method is superior to the others in that the range of the thickness of the metal foils usable in this method is wider than that in the cast method and that the equipment cost is lower than that of the metallizing method. Examples of the equipment for the lamination include a hot roll laminator and a double belt press machine that can continuously conduct lamination while unreeling a material wound into a roll. Of these, the hot-roll laminator is preferable from the standpoint of productivity.

According to a conventional process for preparing a three-layer FPC by the lamination method, a thermosetting resin has been used to form the adhesive layer. Thus, lamination at less than 200° C. has been possible (refer to Japanese Unexamined Patent Application Publication No. 9-199830). In contrast, since the two-layer FPC uses a thermoplastic polyimide in the adhesive layer, a high temperature of at least 200° C. and sometimes near 400° C. is necessary in order to yield thermal bondability. Thus, a flexible metal-clad laminate produced by the lamination suffers from residual strain, which causes dimensional change when wiring is formed by etching or when solder reflow is conducted to mount a component.

For example, in a lamination method, a polyamic acid, which is a precursor of the thermoplastic polyimide, is flow-cast or applied, and continuously heated to perform imidization so as to form a thermoplastic polyimide-containing adhesive layer on a polyimide film, and then a metal foil is bonded thereon. Since heat and pressure are continuously applied not only in the step of imidization but also in the step of bonding the metal layer, the material is frequently placed in a high-temperature environment with a tension applied on the material. The tension is released in the step of etching the metal foil of the flexible laminate and in the step of heating during solder reflow; therefore, the dimensions frequently change before and after these steps.

Ever increasing demands for miniaturization and weight reduction of electronic components have also promoted development of finer wiring to be formed on a substrate. Components mounted on the substrate are also required to achieve miniaturization and higher density. If the dimensional change after such fine wiring is formed is large, the position of the component mounted may deviate from the position originally designed, thereby generating problem such as defective coupling between the components and the substrate.

Thus, various attempts have been made to suppress the dimensional change by controlling the lamination pressure, by controlling the tension applied to the adhesive film (refer to Japanese Unexamined Patent Application Publication Nos. 2002-326308 and 2002-326280).

Although the techniques disclosed in these publications improve dimensional changes, the degree of improvement is not sufficient. A further improvement on dimensional changes is desired.

DISCLOSURE OF THE INVENTION

Problems to be Solved by the Invention

The present invention provides an adhesive film that undergoes smaller dimensional changes and a flexible metal-clad laminate prepared by bonding a metal foil onto the adhesive film.

Means for Solving the Problems

1. The present inventors have conducted extensive studies and found that the dimensional changes that occur in the process of making FCCL (flexible metal-clad laminates) and FPC (in particular, the process of patterning the copper foil of an FCCL by etching and the process of heating the patterned FPC) can be suppressed when the coefficient of linear expansion of the adhesive polyimide film having a thermoplastic polyimide adhesive layer in the MD and TD directions in the temperature range of 100° C. to 200° C. satisfy particular relationships.

In particular, the present inventors have found that when an adhesive film produced by a continuous process has coefficient of linear expansion in the MD and TD directions satisfying particular relationships across the entire width, the thermal stress generated during the imidization to prepare the thermoplastic polyimide or during the lamination with a metal foil can be reduced and dimensional changes can be effectively suppressed. Based on these findings, the present invention has been made.

The present invention provides the following novel adhesive films and flexible metal-clad laminates, and production methods therefor which can solve the above-mentioned problems.

1) An adhesive film comprising:
a polyimide film; and
an adhesive layer containing a thermoplastic polyimide formed on at least one surface of the polyimide film, wherein a coefficient of linear expansion of the adhesive film satisfies the relationship:

$1.0 >$ (coefficient of linear expansion in the $MD$ direction)/(coefficient of linear expansion in the $TD$ direction)$> 0.1$ wherein the coefficient of linear expansion is an average value in the temperature range of 100° C. to 200° C.

2) An adhesive film comprising:
a polyimide film; and
an adhesive layer containing a thermoplastic polyimide formed on at least one surface of the polyimide film, wherein the adhesive film is produced by a continuous process and has a coefficient of linear expansion across the entire width of the adhesive film satisfying the relationship:

$1.0 >$ (coefficient of linear expansion in the $MD$ direction)/(coefficient of linear expansion in the $TD$ direction)$> 0.1$ wherein the coefficient of linear expansion is an average value in the temperature range of 100° C. to 200° C.

3) The adhesive film according to above 2) or 3), wherein the adhesive film is a long film having a width of 250 mm or more.

4) The adhesive film according to 1) to 3), wherein a metal foil can be bonded in a continuous process onto the adhesive film under heating and pressure using at least one pair of metal rollers.

5) A flexible metal-clad laminate comprising:
the adhesive film according to any one of 1) to 4), and a metal foil bonded onto the adhesive film.

6) A method for making a flexible metal-clad laminate, comprising:
bonding a metal foil onto the adhesive film according to any one of 1) to 3) by a continuous process under heating and pressure.

2. Furthermore, the present inventors have conducted extensive studies and found that the dimensional changes that occur in the process of making FPC and (in particular, the process of patterning the copper foil of an FCCL by etching and the process of heating the patterned FPC) can be suppressed when the elastic modulus of an adhesive polyimide film having a thermoplastic polyimide adhesive layer on at least one surface satisfies particular relationships.

In particular, the present inventors have found that when an adhesive film produced by a continuous process has elastic modulus satisfying particular relationships across the entire width, the thermal stress generated during the imidization to prepare the thermoplastic polyimide or during the lamination with a metal foil can be reduced and dimensional changes can be effectively suppressed. Based on these findings, the present invention has been made.

The present invention provides a novel adhesive film, a flexible metal-clad laminate and a process of producing the same which can solve above-mentioned problems.

7) An adhesive film comprising:
a polyimide film; and
an adhesive layer containing a thermoplastic polyimide formed on at least one surface of the polyimide film, wherein the adhesive film has an elastic modulus in the MD direction of 5 GPa or more and satisfies the relationship:

$1.70 >$ (elastic modulus in the $MD$ direction)/(elastic modulus in the $TD$ direction)$> 1.05$ 8) An adhesive film comprising:
a polyimide film; and
an adhesive layer containing a thermoplastic polyimide formed on at least one surface of the polyimide film, wherein the adhesive film is produced by a continuous process and satisfies the relationship:

$1.70 >$ (elastic modulus in the $MD$ direction)/(elastic modulus in the $TD$ direction)$> 1.05$ when the elastic modulus of the adhesive film in the MD direction across the entire width is 5 GPa or more.

9) The adhesive film according to 7) or 8), wherein the adhesive film is a long film having a width of 250 mm or more.

10) The adhesive film according to 7) to 9), wherein the adhesive film is used in a continuous process of bonding a metal foil onto the adhesive film under heating and pressure using at least one pair of metal rollers.

11) A flexible metal-clad laminate comprising:
the adhesive film according to any one of 7) to 10); and a metal foil bonded onto the adhesive film.

12) A method for making a flexible metal-clad laminate, comprising: bonding a metal foil onto the adhesive film according to 7) to 9) by a continuous process under heating and pressure.

3. Furthermore, the present inventors have conducted extensive studies and found that the dimensional changes that occur in the process of making FPC and (in particular, the process of patterning the copper foil of an FCCL by etching and the process of heating the patterned FPC) can be suppressed when the elastic modulus of an adhesive polyimide film having a thermoplastic polyimide adhesive layer on at least one surface satisfies particular relationships.

In particular, the present inventors have found that when an adhesive film produced by a continuous process has elastic modulus satisfying particular relationships across the entire width, the thermal stress generated during the imidization to prepare the thermoplastic polyimide or during the lamination with a metal foil can be reduced and dimensional changes can be effectively suppressed. Based on these findings, the present invention has been made.

The present invention provides a novel adhesive film, a flexible metal-clad laminate and a process of producing the same which can solve above-mentioned problems.

13) An adhesive film comprising:
a polyimide film; and
an adhesive layer containing a thermoplastic polyimide formed on at least one surface of the polyimide film, wherein the adhesive film has an elastic modulus in the MD direction of less than 5 GPa and satisfies the relationship:

$2.00 >$ (elastic modulus in the $MD$ direction)/(elastic modulus in the $TD$ direction)$> 1.10$ 14) An adhesive film comprising:
a polyimide film; and
an adhesive layer containing a thermoplastic polyimide formed on at least one surface of the polyimide film, wherein the adhesive film is produced by a continuous process and satisfies the relationship:

$$2.00 > (\text{elastic modulus in the MD direction})/(\text{elastic modulus in the TD direction}) > 1.10$$

when the elastic modulus of the adhesive film in the MD direction across the entire width is less than 5 GPa.

15) The adhesive film according to 13) or 14), wherein the adhesive film is a long film having a width of 250 mm or more.

16) The adhesive film according to 13) to 15), wherein the adhesive film is used in a continuous process of bonding a metal foil onto the adhesive film under heating and pressure using at least one pair of metal rollers.

17) A flexible metal-clad laminate comprising:
the adhesive film according to any one of 13) to 16); and a metal foil bonded onto the adhesive film.

18) A method for making a flexible metal-clad laminate, comprising:
bonding a metal foil onto the adhesive film according to any one of 13) to 15) by a continuous process under heating and pressure.

Effects of the Invention

The adhesive film and the flexible metal-clad laminate of the present invention undergo smaller dimensional changes, in particular, smaller dimensional changes when subjected to a lamination process.

In particular, the ratio of dimensional change in the MD and TD directions before and after the removal of the metal foil can be decreased, and the difference in dimensional change between the MD direction and the TD direction can be decreased to, for example, 0.30% or less.

Moreover, the cumulative value of the ratio of dimensional change before and after the removal of the metal foil and the ratio of dimensional change before and after 30 minutes of heating at 250° C. after the metal foil removal can be reduced in both the MD direction and the TD direction. Thus, the difference in cumulative value between the MD direction and the TD direction can be reduced to, for example, 0.60% or less.

Thus, the present invention is suitable for FPCs having fine wiring and can overcome the problem of misalignment. In particular, when the present invention is applied to an adhesive film produced by a continuous process having a width of 250 mm or more, not only the dimensional changes are suppressed but also the ratio of dimensional change across the entire width of the film can be stabilized.

BEST MODE FOR CARRYING OUT THE INVENTION

The preferred embodiments of the present invention will now be described in detail.

An adhesive film according to a preferred embodiment of the present invention includes a polyimide film having at least one surface provided with an adhesive layer composed of a thermoplastic polyimide.

(1) In the present invention, the coefficient of linear expansion of the adhesive film in both the MD direction and the TD direction are specified. In this manner, the difference in the ratio of dimensional change in both the MD and TD directions before and after removal of the metal foil of a flexible metal-clad laminate composed of the adhesive film and a metal foil bonded thereto can be reduced. Moreover, the cumulative value of the ratio of dimensional change before and after the removal of the metal foil and before and after the heating that follows the removal can be decreased.

In particular, the adhesive film of the present invention has coefficient of linear expansion satisfying the relationship:

$$1.0 > (\text{coefficient of linear expansion in the MD direction})/(\text{coefficient of linear expansion in the TD direction}) > 0.1,$$

wherein the coefficient of linear expansion is an average value in the temperature range of 100° C. to 200° C.

When the coefficient of linear expansion in the MD direction is smaller than the coefficient of linear expansion in the TD direction, a flexible metal-clad laminate prepared by bonding a metal foil onto the adhesive film has a smaller difference between the ratio of dimensional change before and after the removal of the metal foil in the MD direction and that in the TD direction. Moreover, the cumulative value of the rates of dimensional change before and after the removal of the metal foil and before and after the heating that follows the removal can be decreased.

As stated above, the ratio, (coefficient of linear expansion in the MD direction)/(coefficient of linear expansion in the TD direction), must be smaller than 1.0 and larger than 0.1.

When the ratio (coefficient of linear expansion in the MD direction)/(coefficient of linear expansion in the TD direction) is less than 1.0, the dimensional change that occurs during the FPC production process can be decreased.

When the ratio (coefficient of linear expansion in the MD direction)/(coefficient of linear expansion in the TD direction) is less than 1.0, the dimensional change can be decreased. However, at an excessively small ratio, the dimensional changes in the MD and TD directions may not maintain a desired balance. Thus, the lower limit of the ratio is preferably 0.1. At a ratio of 0.1 or less, the dimensional change in the TD direction may be adversely affected.

The coefficient of linear expansion in the respective direction is determined from strip measurement samples taken in the film longitudinal direction and a direction (width direction) perpendicular to the longitudinal direction. The coefficient of linear expansion here is determined by measuring the coefficient of linear expansion with a thermomechanical analyzer, TMA120C produced by Seiko Instruments Inc., as follows. The sample is first heated under a nitrogen stream at a heating rate of 10° C./min in the temperature range of 10° C. to 400° C. during which the measuring was performed. The sample is then cooled to room temperature and is heated under a nitrogen stream at a heating rate of 10° C./min in the temperature range of 10° C. to 400° C. during which the measuring was performed. The observed coefficient of linear expansion for the sample in the temperature range of 100° C. to 200° C. were averaged.

The method for producing an adhesive film having the above-described coefficient of linear expansion is not particularly limited. Examples of the method include (a) a method to control the coefficient of linear expansion of the adhesive film, using a core polyimide film having controlled coefficient of linear expansion in the MD and TD directions and selecting respectively thickness of the polyimide film and the adhesive layer, (b) a method to control the coefficient of linear expansion of the adhesive film, in which an adhesive layer is formed on a polyimide film still containing a volatile component and the polyimide film containing the volatile component is stretched in the TD and/or MD direction; and (c) a method in which a polyimide film layer and an adhesive layer are co-extruded.

When an adhesive film produced by a continuous process has coefficient of linear expansion in the MD and TD directions that satisfy the above-described relationship across the entire width, the dimensional change in an FPC prepared by bonding a metal foil onto the adhesive film by a continuous method, such as a hot roll lamination method, can be effectively suppressed.

It is preferable to employ the method of using a core polyimide film having controlled coefficient of linear expansion in the MD and TD directions and selecting properly thickness of the polyimide film and the adhesive layer so as to control the coefficient of linear expansion of the adhesive film since a desirable adhesive film can be easily produced.

In this invention, the elastic moduli of the adhesive film in both the MD and TD directions are specified so that, when a flexible metal-clad laminate is prepared by bonding a metal foil onto the adhesive film, the difference between the rates of dimensional change in the MD and TD directions before and after the removal of the metal film can be reduced, and the cumulative value of the ratio of dimensional change before and after the removal of the metal foil and the ratio of dimensional change before and after heating following the removal of the metal foil can be reduced.

In particular, the elastic modulus of the adhesive film of the present invention is 5 GPa or more in the MD direction and satisfies the following relationship:

1.70>(elastic modulus in the *MD* direction)/(elastic modulus in the *TD* direction)>1.05.

When the elastic modulus in the MD direction is larger than that in the TD direction and a flexible metal-clad laminate is prepared by bonding a metal foil onto the adhesive film, the difference between the rates of dimensional change in the MD and TD directions before and after the removal of the metal film can be reduced, and the cumulative value of the ratio of dimensional change before and after the removal of the metal foil and the ratio of dimensional change before and after heating following the removal of the metal foil can be reduced.

As is described above, the adhesive film of the present invention must have a ratio, (elastic modulus in the MD direction)/(elastic modulus in the TD direction) smaller than 1.70 and larger than 1.05.

When the ratio, (elastic modulus in the MD direction)/ (elastic modulus in the TD direction) is larger than 1.05, the dimensional change can be improved. At an excessively large ratio, however, the dimensional changes in the MD and TD directions may not maintain a desired balance. Thus, the upper limit of the ratio is preferably 1.70. Otherwise, the dimensional change in the TD direction may be adversely affected.

The elastic modulus in each direction is measured by standard D 882 of ASTM using strip measurement samples taken in the longitudinal direction of the film and in a direction (width direction) perpendicular to the longitudinal direction.

The method for producing an adhesive film having the above-described elastic modulus is not particularly limited. Examples of the method include (a) a method to control the elastic modulus of the adhesive film, using a core polyimide film having controlled elastic moduli in the MD and TD directions and selecting respective thickness of the polyimide film and the adhesive layer; (b) a method to control the elastic modulus of the adhesive film, in which an adhesive layer is formed on a polyimide film still containing a volatile component and the adhesive film with the polyimide film containing the volatile component is stretched in the TD and/or MD direction; and (c) a method in which a polyimide film layer and an adhesive layer are co-extruded.

When an adhesive film produced by a continuous process has elastic modulus that satisfy the above-described relationship across the entire width, the dimensional change in an FPC prepared by bonding a metal foil onto the adhesive film by a continuous method such as a hot roll lamination method, can be effectively suppressed.

It is preferable to employ the method of using a core polyimide film having controlled elastic moduli in the MD and TD directions and selecting properly the thicknesses of the polyimide film and the adhesive layer, so that the target adhesive film can be easily obtained.

When the elastic modulus of the adhesive film of the present invention is less than 5 GPa in the MD direction, the following relationship is preferably satisfied:

2.00>(elastic modulus in the *MD* direction)/(elastic modulus in the *TD* direction)>1.10

When the adhesive film having an elastic modulus in the MD direction larger than that in the TD direction is bonded to a metal foil to prepare a flexible metal-clad laminate, the difference between the ratio of dimensional change in the MD and TD directions before and after the removal of the metal film can be reduced, and the cumulative value of the ratio of dimensional change before and after the removal of the metal foil and the ratio of dimensional change before and after heating following the removal of the metal foil can be reduced.

As described above, the adhesive film of the present invention must have a ratio, (elastic modulus in the MD direction)/ (elastic modulus in the TD direction) less than 2.00 and more than 1.10.

When the ratio (elastic modulus in the MD direction)/ (elastic modulus in the TD direction) is larger than 1.10, the dimensional change can be improved. However, at an excessively large ratio, the dimensional change in the MD and TD directions may not maintain a desired balance. Thus, the upper limit of the ratio is preferably 2.00. Specifically, the dimensional change in the TD direction may be adversely affected.

The elastic modulus in each direction is measured by standard D 882 of ASTM using strip measurement samples taken in the longitudinal direction of the film and in a direction (width direction) perpendicular to the longitudinal direction.

The method for producing an adhesive film having the above-described elastic modulus is not particularly limited. Examples of the method include (a) a method to control the elastic modulus of the adhesive film, using a core polyimide film having controlled elastic moduli in the MD and TD directions and selecting respective thickness of the polyimide film and the adhesive layer; (b) a method to control the elastic modulus of the adhesive film, in which an adhesive layer is formed on a polyimide film still containing a volatile component and the polyimide film containing the volatile component is stretched in the TD and/or MD direction; and (c) a method in which a polyimide film layer and an adhesive layer are co-extruded. When an adhesive film produced by a continuous process has elastic modulus that satisfy the above-described relationship across the entire width, the dimensional change in an PPC prepared by bonding a metal foil onto the adhesive film by a continuous method such as a roll lamination method, can be effectively suppressed.

It is preferable to employ the method of using a polyimide film having controlled elastic modulus in the MD and TD directions and selecting properly the thickness of the polyimide film and the adhesive layer, so that the target adhesive film can be easily obtained.

In the following sections, a polyimide film and a adhesive layer containing a thermoplastic polyimide which constitute the adhesive film of the present invention, a method for making the adhesive film, a flexible metal-clad laminate, and a method for making the flexible metal-clad laminate will be described in that order.

(I) Polyimide Film in the Adhesive Film of the Present Invention

The polyimide film included in the adhesive film of the present invention may be produced by a method including steps of preparing a polyamic acid, i.e., a precursor of polyimide, by polymerization, continuously flow-casting a composition containing the resulting polyamic acid and an organic solvent onto a support to form a gel film, peeling off the gel film from the support and fixing two ends of the gel film, and transferring the film through a heating furnace while fixing the two ends. An example is described in detail below.

(Method 1)

Method 1 for making a polyimide film includes the steps of:

(A) preparing a polyamic acid by polymerization;
(B) flow-casting a composition containing the polyamic acid and an organic solvent onto a support to prepare a gel film;
(C) peeling off the gel film from the support and fixing the two ends of the gel film;
(D) transferring the film through a heating furnace while fixing the two ends of the film; and
(E) after step (D), releasing the two ends of the film and stretching the film under heating.

Step (A) is a step of preparing a polyamic acid, i.e., a precursor of polyimide, by polymerization.

Any known process for producing a polyamic acid may be employed. Typically, substantially equimolar amounts of at least one type of aromatic tetracarboxylic dianhydride and at least one type of aromatic diamine are dissolved in an organic solvent to prepare an organic solvent solution, and the solution is stirred at controlled temperature until the polymerization of the aromatic tetracarboxylic dianhydride and the aromatic diamine is completed. The concentration of the organic solvent solution is typically 5 to 35 wt %, and preferably 10 to 30 wt %. At a concentration within this range, an adequate molecular weight and an adequate solution viscosity can be obtained.

Any known polymerization process may be employed. In particular, preferable processes are as follows:

Those are:

1) A process including dissolving an aromatic diamine in an organic polar solvent and reacting the aromatic diamine with the substantially equimolar amount of an aromatic tetracarboxylic dianhydride to conduct polymerization;

2) A process including reacting an aromatic tetracarboxylic dianhydride and fewer moles of an aromatic diamine in an organic polar solvent to prepare a prepolymer having acid anhydride groups at the both ends and polymerizing the prepolymer with an additional aromatic diamine so that the aromatic tetracarboxylic dianhydride and the aromatic diamine are substantially equimolar in the whole process;

3) A process including reacting an aromatic tetracarboxylic dianhydride and excess moles of an aromatic diamine in an organic polar solvent to prepare a prepolymer having amino groups at the both ends, adding an additional aromatic diamine to the prepolymer, and then adding an additional aromatic tetracarboxylic dianhydride so that the aromatic tetracarboxylic dianhydride and the aromatic diamine are substantially equimolar in the whole process to conduct polymerization;

4) A process including dissolving and/or dispersing an aromatic tetracarboxylic dianhydride in an organic polar solvent and polymerizing the aromatic tetracarboxylic dianhydride with a substantially equimolar amount of an aromatic diamine;

5) A process including reacting a substantially equimolar mixture of an aromatic tetracarboxylic dianhydride and an aromatic diamine in an organic polar solvent to conduct polymerization. Any one or combination of these processes may be employed.

The materials contained in the polyamic acid-organic solvent composition of the present invention will now be described.

Examples of aromatic tetracarboxylic dianhydride suitable for the present invention include pyromellitic dianhydride, 2,3,6,7-naphthalenetetracarboxylic dianhydride, 3,3',4,4'-biphenyltetracarboxylic dianhydride, 1,2,5,6-naphthalenetetracarboxylic dianhydride, 2,2',3,3'-biphenyltetracarboxylic dianhydride, 3,3',4,4'-benzophenonetetracarboxylic dianhydride, 2,2-bis(3,4-dicarboxyphenyl)propane dianhydride, 3,4,9,10-perylenetetracarboxylic dianhydride, bis(3,4-dicarboxyphenyl)propane dianhydride, 1,1-bis(2,3-dicarboxyphenyl)ethane dianhydride, 1,1-bis(3,4-dicarboxyphenyl)ethane dianhydride, bis(2,3-dicarboxyphenyl)methane dianhydride, bis(3,4-dicarboxyphenyl)ethane dianhydride, 4,4'-oxydiphthalic dianhydride, bis(3,4-dicarboxyphenyl)sulfone dianhydride, p-henylene bis(trimellitic acid monoester anhydride), ethylene bis(trimellitic acid monoester anhydride), bisphenol A bis(trimellitic acid monoester anhydride), and analogues thereof. These may be used alone or in combination at any desirable mixing ratio.

Examples of aromatic diamines suitable for use in the polyamic acid of the present invention include 4,4'-diaminodiphenyl propane, 4,4'-diaminodiphenyl methane, benzidine, 3,3'-dichlorobenzidine, 3,3'-dimethylbenzidine, 2,2'-dimethylbenzidine, 3,3'-dimethoxybenzidine, 2,2'-dimetoxybenzidine, 4,4'-diaminodiphenyl sulfide, 3,3'-diaminodiphenylsulfone, 4,4'-diaminodiphenylsulfone, 4,4'-oxydianiline, 3,3'-oxydianiline, 3,40-oxydianiline, 1,5-diaminonaphthalene, 4,4'-diaminodiphenyldiethylsilane, 4,4'-diaminodiphenylsilane, 4,4'-diaminodiphenylethyl phosphine oxide, 4,4'-diaminodiphenyl N-methylamine, 2,2'-bis(4-aminophenoxyphenyl)propane, 4,4'-diaminodiphenyl N-phenylamine, 1,4-diaminobenzene(p-phenylenediamine), 1,3-diaminobenzene, 1,2-diaminobenzene, bis{4-(4-aminophenoxy)phenyl}sulfone, bis{4-(3-aminophenoxy)phenyl}sulfone, 4,4-bis(4-amionphenoxy)biphenyl, 4,4'-bis(3-aminophenoxy)biphenyl, 1,3-bis(3-aminophenoxy)benzene, 1,3-bis(4-aminophenoxy)benzene, 1,3-bis(4-aminophenoxy)benzene, 1,3-bis(3-aminophenoxy)benzene, 3,3'-diaminobenzophenone, 4,4'-diaminobenzophenone, p-phenylenediamine, and analogues thereof.

As the aromatic diamine component, a combination of an aromatic diamine having a rigid structure and an aromatic diamine having a flexible structure may be used. In order to control the coefficient of linear expansion of the resulting film, the content of the aromatic diamine having a rigid structure may be increased to decrease the coefficient of linear expansion or the content of the aromatic diamine having a flexible structure may be increased to increase the coefficient of linear expansion.

In the present invention, the "aromatic diamine having a rigid structure" is a compound represented by formula (1):

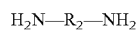   (1)

wherein R₂ represents a group selected from divalent aromatic groups having the following structures:

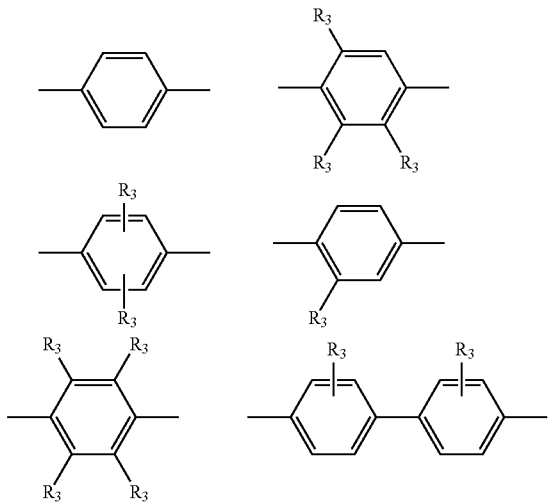

wherein R₃s may be the same or different and each represent a group selected from the group consisting of H—, CH₃—, —OH, —CF₃, —SO₄, —COOH, —CO—NH₂, Cl—, Br—, F—, and CH₃O—.

The "diamine having a flexible structure" is a diamine having a flexible structure, such as an ether group, a sulfone group, a ketone group, or a sulfide group, and is preferably a group represented by general formula (2):

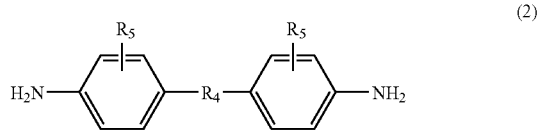
(2)

wherein R₄ represents a divalent organic group selected from the group consisting of

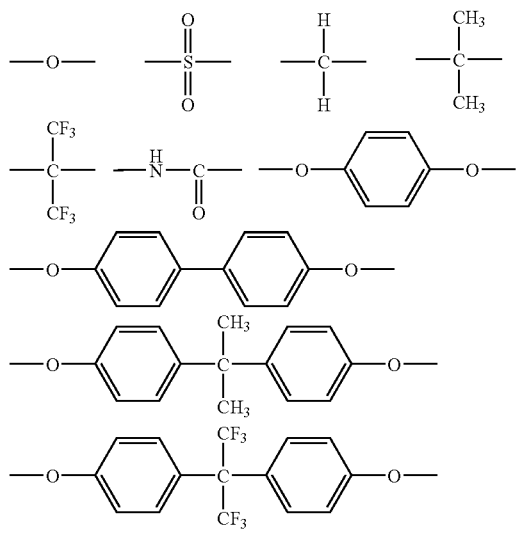

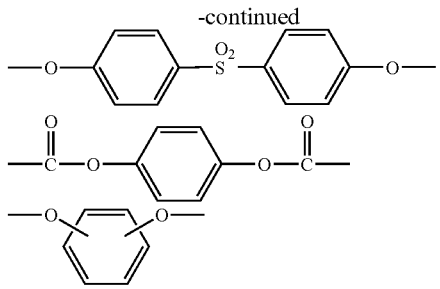

, and R₅s may be the same or different and each represent a group selected from the group consisting of H—, CH₃—, —OH, —CF₃, —SO₄, —COOH, —CO—NH₂, Cl—, Br—, F—, and CH₃O—.

The polyimide film used in the present invention can be produced by selecting appropriate types of aromatic tetracarboxylic dianhydride and aromatic diamine and the mixing ratio thereof within the above-described ranges so that the resulting film has desired properties.

From the standpoint of controlling the film properties other than the coefficient of linear expansion required for FPC, such as the chemical resistance, moisture absorption, and hygroscopic expansion coefficient, it is preferable to use, as an acid component, at least one aromatic tetracarboxylic dianhydride selected from the group consisting of pyromellitic dianhydride, 3,3',4,4'-benzophenonetetracarboxylic dianhydride, 4,4-oxydiphthalic dianhydride, 3,3',4,4'-biphenyltetracarboxylic dianhydride, and p-phenylene bis(trimellitic acid monoester anhydride).

When at least one aromatic tetracarboxylic dianhydride selected from the group consisting of 3,3',4,4'-benzophenonetetracarboxylic dianhydride, 4,4'-oxyphthalic dianhydride, 3,3',4,4'-biphenyltetracarboxylic dianhydride, and p-phenylene bis(trimellitic acid monoester anhydride) is used, the content relative to the total content thereof is preferably 60 mol % or less, more preferably 55 mol % or less, and most preferably 50 mol % or less relative to the total of the acid anhydride. When at least one aromatic tetracarboxylic dianhydride selected from the group consisting of 3,3',4,4'-benzophenonetetracarboxylic dianhydride, 4,4-oxydiphthalic dianhydride, 3,3',4,4'-biphenyltetracarboxylic dianhydride, and p-phenylene bis(trimellitic acid monoester anhydride) is contained in an amount exceeding this range, the glass transition temperature of the resulting polyimide film may be excessively decreased or the high-temperature storage elastic modulus may be excessively decreased, thereby making the film production difficult. When a pyromellitic dianhydride is used, the amount used is preferably 40 to 100 mol %, more preferably 45 to 100 mol %, and most preferably 50 to 100 mol %. When the pyromellitic dianhydride is used in an amount within this range, the glass transition temperature and storage elastic modulus at the high temperature can be easily adjusted within a range suitable for use or the film production.

The aromatic diamine component to be used is preferably 4,4'-oxydianiline or p-phenylenediamine since the film properties required for FPC other than coefficient of linear expansion, i.e., chemical resistance, moisture absorption, and hygroscopic expansion coefficient can be controlled.

From the standpoint of facilitating the control of the coefficient of linear expansion and the elastic modulus, the aromatic diamine component is preferably 4,4'-diaminodiphenyl ether having a flexible structure or p-phenylenediamine having a rigid structure, and more preferably is a combination of 4,4'-diaminodiphenyl ether and p-phenylenediamine.

From the standpoint of environment resistance (resistance to exposure to high temperature and high humidity) of the resulting film, the content of the diamine having a rigid structure is preferably 80 mol % or less and more preferably 75 mol % or less relative to the total of the diamines.

Among the polyimide films described above, particularly preferred is a polyimide film having repeating units represented by general formulae (3) to (6) in the molecule from the standpoint of film properties (elastic modulus, coefficient of linear expansion, and hygroscopic expansion coefficient):

of the solvent include amide solvents, such as N,N-dimethylformamide (hereinafter referred to as "DMF"), N,N-dimethylacetamide (hereinafter referred to as "DMAc"), and N-methyl-2-pyrrolidone (hereinafter referred to as "NMP'"). N,N-dimethylformamide and N,N-dimethylacetamideare particularly preferable.

Step (B)

Step (B) is a step of flow-casting a composition containing a polyamic acid and an organic solvent (hereinafter also referred to as "polyamic acid solution") onto a support to General formulae (3) to (6)

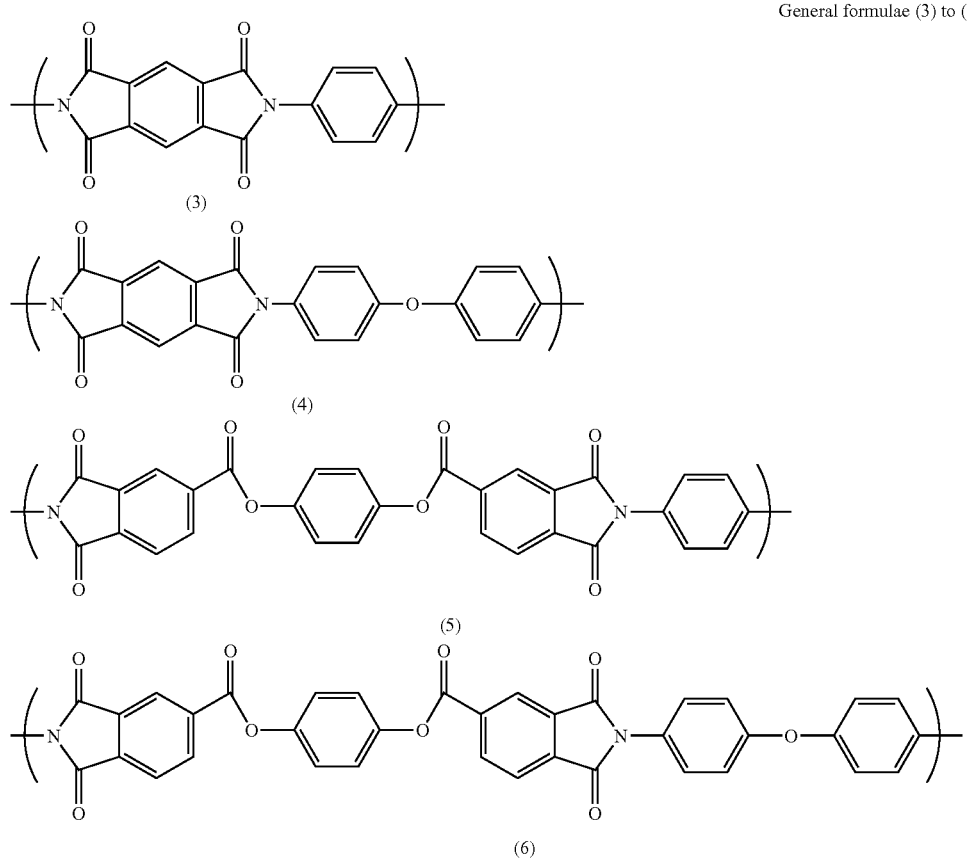

Preferably, (a+b)/s, (a+c)/s, (b+d)/s, and (c+d)/s are all in the range of 0.20 to 0.80 wherein a, b, c, and d represent the numbers of the repeating units represented by general formulae (3) to (6), respectively, in the molecule and s represents the total of a, b, c, and d.

In order to yield an adequate elastic modulus, at least pyromellitic dianhydride, 4,4'-diaminodipheny ether, and p-phenylenediamine are preferably used together. From the standpoint of environment resistance (deterioration due to exposure to high temperature and high humidity), workability, and properties (controllability of elastic modulus) of the film, the amount of the 4,4'-diaminodipheny ether used is preferably at least 35 mol % and the amount of the p-phenylenediamine is preferably 65 mol % or less relative to the total of the aromatic diamine component.

The solvent for synthesizing the polyamic acid may be any solvent that dissolves the polyamic acid. Preferable examples form a gel film. The composition may contain other additives such as a reagent reactive to the polyamic acid.

A conventional method may be used to convert the polyamic acid solution to polyimide. The conversion method can be categorized into two: thermal imidization and chemical imidization. In thermal imidization, imidization is conducted solely by heating without using any dehydrator or imidization catalyst.

The heating conditions differ according to the type of polyamic acid used, the thickness of the film, and the like.

In chemical imidization, a solution of polyamic acid in an organic solvent is interacted with a dehydrator and an imidization catalyst.

Examples of the dehydrator include aliphatic acid anhydrides such as acetic anhydrides and aromatic acid anhydrides such as benzoic anhydrides.

Examples of the imidization catalyst include aliphatic tertiary amines such as triethylamine, aromatic tertiary amines such as dimethylaniline, and heterocyclic tertiary amines such as pyridine, picoline, and isoquinoline.

The dehydrator is preferably an acetic anhydride, and the imidization catalyst is preferably isoquinoline. To one mole of amic acid in the polyamic acid organic solvent solution, 1.0 to 4.0, preferably 1.2 to 3.5, and most preferably 1.5 to 2.5 moles of acetic anhydride is added, and, to one mole of amic acid in the polyamic acid organic solvent solution, 0.1 to 2.0, preferably 0.2 to 1.5, more preferably 0.3 to 1.2, and most preferably 0.3 to 1.1 moles of isoquinoline is preferably added to prepare a polyimide film of desired properties.

A filler may be added to improve various film properties, such as slidability, thermal conductivity, electrical conductivity, corona resistance, and loop stiffness. Any filler may be used. Examples of the preferred filler include silica, titanium oxide, alumina, silicon nitride, boron nitride, calcium hydrogen phosphate, calcium phosphate, and mica.

The particle diameter of the filler is determined according to the film properties to be improved and the type of filler and is thus not particularly limited. The average particle diameter is usually 0.05 to 100 μm, preferably 0.1 to 75 μm, more preferably 0.1 to 50 μm, and most preferably 0.1 to 25 μm. At a particle diameter below this range, the effect of improving the property may not be sufficiently achieved. At a particle diameter above this range, the surface quality and/or mechanical properties may be significantly degraded. The amount of the filler to be added is also determined according to the film properties to be improved and the type of filler and is thus not particularly limited. The filler content is usually 0.01 to 100 parts by weight, preferably 0.01 to 90 parts by weight, and more preferably 0.02 to 80 parts by weight per 100 parts by weight of polyimide. At a filler content below this range, the effect of improving the property may not be sufficiently achieved. At a filer content above this range, the mechanical properties may be significantly degraded.

The filler may be added by any technique. Examples thereof include i) a technique of adding the filler to a reaction solution before or during the polymerization; ii) a technique of adding a filler after termination of the polymerization so as to knead the filler with the product using a triple roller mill; and iii) a technique of preparing a dispersion liquid containing the filler and mixing the dispersion with a polyamic acid organic solvent solution. In order to satisfactorily disperse the filler and/or stabilize the state of dispersion, a dispersant, thickener, or the like may be added in amounts that do not adversely affect the film properties.

The resulting composition is continuously flow-cast onto a support. The support may be any support that does not dissolve in the resin solution but can withstand heat for removing the organic solvent in the resin solution. An endless belt including connected metal boards and a metal drum are particularly preferable since they are suitable for drying the solution applied thereon.

The endless belt or the drum is preferably composed of metal and more preferably composed of stainless steel. The surface is preferably plated with metal, such as chromium, titanium, nickel, or cobalt, to increase the adhesion between the solvent and the surface. The surface is preferably plated so that a dried organic insulating film can easily separate from the surface. The surface of the endless belt or the metal drum is preferably flat, but, alternatively, may have numerous irregularities. The irregularities formed on the endless belt or the metal drum preferably have a diameter of 0.1 to 100 μm and a depth of 0.1 to 100 μm. By forming irregularities in the metal surface, fine protrusions can be formed on the surface of the organic insulating film so that the protrusions can prevent the films from scratching due to friction each other and improve the slidability of the films.

In the present invention, the "gel film" is a polymeric resin film which is formed by heating and drying the polyamic acid solution and contains the residual organic solvent and/or a reaction product (hereinafter referred to as "residual components"). In the process of producing the polyimide film, the organic solvent dissolving the polyamic acid solution, an imidization catalyst, a dehydrator, reaction products (water-absorbing components of the dehydrator, water, etc.), and the like remain as the residual components in the gel film.

The residual component content c in the gel film is determined by the equation below:

$$c = a/b \times 100 \tag{1}$$

wherein a (unit: g) is the weight of a completely dried synthetic resin in the gel film and b (unit: g) is the weight of the residual components. The residual component content c is preferably 500% or less, more preferably 10% to 300%, and most preferably 20% to 100%. At a residual component content exceeding 500%, the variation in residual component content in the plane of the film relatively increases, and it may become difficult to control the properties of the film to a uniform level.

In order to easily obtain a film having molecules oriented in the MD direction, the variation in the content of the residual components in the plane of the film preferably satisfies the relationship (2):

$$0.8X \leq x \leq 1.2X \tag{2}$$

wherein X is the content of the residual components.

In order to control X within the above-described range (2), for example, when drying is applied on the support by a jet-nozzle technique, the hot air may be delivered in a direction as perpendicular as possible with respect to the film, the hot air may be delivered for the region wider than the film width on the support, or the temperature may be adjusted to be as uniform as possible in the film width direction.

The weight a of the completely dried synthetic resin and the weight b of the residual components are determined as follows. The weight d of a 100 mm×100 mm gel film is measured. The gel film is dried in an oven at 450° C. for 20 minutes, cooled to room temperature, and weighed. The observed weight is defined as the weight a of the completely dried synthetic resin. The weight b of the residual component is the difference between the weight d of the gel film and the weight a of the completely dried synthetic resin, (b=d−a).

In making the gel film, the temperature, air speed, and air discharge speed for heating and drying the solution on the support are preferably controlled so that the residual component content is controlled within the above-described range. In making a polyimide film, the organic solvent solution containing the polymer and the organic solvent is preferably heated and dried in the temperature range of 50° C. to 200° C., and more preferably in the range of 50° C. to 180° C. The solution is preferably dried within 20 seconds to 30 minutes under multistage temperature control.

Step (C)

In the step (C), the gel film is peeled off from the support and the both ends of the gel film are fixed continuously. In the present invention, the step of fixing the ends of the gel film refers to a step of holding ends of a gel film using typical holders used in typical film production systems, such as pin seats and clips.

Step (D)

In step (D), the film is transferred through a heating furnace while the two ends of the film are fixed. The maximum atmospheric temperature in step (D) is preferably 450° C. or less so that a film having controlled coefficient of linear expansion or elastic moduli in the MD and TD directions across the entire width can be obtained. More preferably, the maximum atmospheric temperature is 400° C. or less.

The term "atmospheric temperature" refers to the temperature near the film traveling through the furnace when the heater is a far-infrared heater tenter. When the heater uses circulating hot air, it refers to the temperature of the circulating hot air.

The heating in step (D) is preferably hot-air heating or far-infrared heating so that the film can be uniformly heated in the width direction (TD direction) of the film. A combination of hot-air heating and far-infrared heating is also preferred since the film can be uniformly heated in the width direction (TD direction). When the heating in step (D) is conducted by hot-air heating, the heating temperature is preferably 450° C. or less and more preferably 400° C. or less. When the heating in step (D) is conducted by far-infrared heating, the temperature is preferably 430° C. or less and more preferably 400° C. or less.

The film may be baked by hot-air heating and/or far-infrared heating using one or more hot-air furnaces, one or more far-infrared heating furnaces, or a combination of hot-air and far-infrared heating furnaces.

Step (E)

In step (E), the film is released from the pins, clips, etc., fixing the two ends after step (D) and is heated with its ends released.

In step (E), the tension applied to the film is preferably 0.10 to 1.50 kg/mm$^2$. At a tension less than 0.10 kg/mm$^2$, it may become difficult to control the coefficient of linear expansion or elastic moduli in the MD and TD directions. At a tension exceeding 1.5 kg/mm$^2$, the flatness of the film may be decreased. More preferably, the tension is 0.20 to 1.0 kg/mm$^2$, and most preferably the tension is 0.20 to 0.80 kg/mm$^2$.

The maximum atmospheric temperature during heating in step (E) is preferably 430° C. or more to obtain a film having molecules of controlled orientation across the entire width. More preferably, the maximum atmospheric temperature is 450° C. or more and most preferably 500° C. or more.

The heating in step (E) is preferably conducted by hot-air heating or far-infrared heating so that the film can be uniformly heated in the width direction (TD direction). A combination of hot-air heating and far-infrared heating is also preferred since the film can be uniformly heated in the width direction (TD direction).

The hot-air heating in step (E) is preferably conducted at 430° C. or more, more preferably 450° C. to 570° C., and most preferably 470° C. to 560° C. The far-infrared heating is preferably conducted at 400° C. or more, more preferably 430° C. to 570° C., and most preferably 450° C. to 560° C.

In step (E), it is also preferable to simultaneously conduct hot-air heating and far-infrared heating so that the film can be uniformly heated in the width direction (TD direction). The temperature here is preferably 400° C. or more and more preferably 430° C. to 570° C.

The hot-air furnaces and far-infrared heater furnaces usable in step (E) are the same as those described in step (B).

After releasing the ends of the film, the film, i.e., low-temperature-baked film, may be wound and then subjected to step (E). For example, after step (D), the wound low-temperature-baked film may be passed through a heating furnace, such as a hot-air furnace or a far-infrared heating furnace, having a film transferring unit that can control the tension by a roll-to-roll technique, and then step (E) may be performed. Alternatively, after step (D), the film may be continuously passed through a heating furnace, such as a hot-air furnace or a far-infrared heating furnace, without fixing the ends with pins or the like.

The thickness of the organic insulating film for FCCL and FPC applications over the entire plane is preferably as described below from the standpoint of workability during application of the adhesive and the ratio of dimensional change during the FPC production process.

(Thickness)

Where the target thickness (center value) is given as T µm.
(A) the thickness is at least T−T×0.10 µm but not more than T+T×0.10 µm over the entire plane;
(B) in the film traveling direction (MD direction), maximum thickness−minimum thickness≦T×0.15 µm; and
(C) in a direction (TD direction) orthogonal to the film traveling direction, maximum thickness−minimum thickness≦T×0.15 µm.

The conditions (A) to (C) are preferably satisfied simultaneously.

(Method 2)

Method 2 for continuously producing an organic insulating film includes steps of:
(A) preparing a polyamic acid by polymerization;
(B) flow-casting a composition containing the polyamic acid and an organic solvent onto a support and then preparing a gel film;
(C) peeling off the gel film from the support and fixing the two ends of the gel film; and
(D) transferring the film through a heating furnace while fixing the two ends of the film.
Step (D) includes step (D-1) of transferring the film by applying substantially no tension to the film in the film width direction (TD direction) in at least part of step (D-1)

Step (A)

Step (A) may be identical to step (A) of method 1 described above.

Step (B)

Step (B) may be identical to step (B) of method 1 described above. The content of the residual components in the gel film is preferably 500% or less, more preferably 25% to 250%, and most preferably 30% to 200%.

Step (C)

Step (C) may be identical to step (C) of method 1 described above. For fixing the film without applying tension substantially to the film in the TD direction in at least part of step (D) described below, the film may be fixed while applying substantially no tension to the film in the TD direction in this step (C). In this manner, the film can be transferred, as it is, into step (D). Specifically, in this step the ends of the film are fixed while the film is being relaxed.

Step (D)

In step (D), the film is transferred through a heating furnace while having its ends fixed. In this invention, in at least part of step (D), the film is transferred through the heating furnace while applying substantially no tension to the film in the TD direction (step D-1). When the step (D) includes step D-1, an organic insulating film having molecules oriented in the MD direction can be produced.

Here, "applying substantially no tension in the TD direction" means that no tensile force other than the one from the own weight of the film is applied in the TD direction, i.e., no tensile force caused by mechanical handling is applied. To be more specific, a distance (FIGS. 1, 7) between fixing units for fixing the both ends of the film is smaller than a width (FIGS. 1, 8) of the film between the fixing units.

Referring again to FIG. 1, the film is held between the fixing units, and the distance 7 is the distance between the fixing units, i.e., the fixed ends of the film. When the film is tightly stretched across the fixing units by applying a tension, the distance 7 between the fixing units is the same as the width 8 of the film between the fixing units. However, the film width 8 is larger than the distance 7 in this example. That is, the film is relaxed in the TD direction (width direction) and fixed. From the standpoint of control of molecular orientation in the MD direction, the distance 7 and the width 8 preferably satisfy the relationship:

$$20.0 \geq (Y-X)/Y \times 100 > 0.00 \quad (3-1)$$

wherein X represents the distance 7 between the fixing units and Y represents the width 8 of the film between the fixing units.

When $(Y-X)/Y \times 100$ (hereinafter also referred to as "TD contraction ratio") is increased beyond the above-described range, it becomes difficult to stably control the relaxing of the film, and the amount of relaxation may vary relative to the direction of the transfer. In some cases, the film may drop from the fixing units due to relaxing, and stable film production may not be ensured. More preferably, the relationship $15.0 \geq (Y-X)/Y \times 100 > 0.00$ is satisfied, and most preferably the relationship $10.0 \geq (Y-X)/Y \times 100 > 0.00$ is satisfied.

In this invention, the film is preferably fixed so that substantially no tension is applied in the TD direction at the entry of the furnace in the step (D) from the standpoint of producing a film having an orientation axis in the MD direction across the entire film width.

Technique 1:

In order to fix and transfer the film so that substantially no tension is applied in the TD direction at the entry of the furnace in the step (D), the ends of the gel film may be fixed in the preceding step (C) so that substantially no tension is applied in the TD direction. In this manner, the film may be directly transferred from step (C) to step (D).

Technique 2:

Alternatively, after step (C), the distance between the fixed ends may be reduced (as in the system shown in FIG. 2) and then the film is transferred to step (D).

In technique 1, the two ends of the gel film are preferably fixed to satisfy the relationship (3-1) above.

In technique 2, the distance between the fixed ends is preferably reduced to satisfy relationship (3-2) below:

$$0.00 > (B-X)/X \times 100 > -20.0 \quad (3-2)$$

wherein X is the distance between the fixed ends at position that starts fixing of the gel film, and B is the distance between the fixed ends at the entry of or inside the heating furnace, as shown in FIG. 2.

Technique 3:

Alternatively, the reduction of the distance between the fixed ends may be conducted after the film is transferred into the heating furnace in step (D).

These techniques may be used in combination. In technique 3, the reduction of the distance between the fixed ends is preferably conducted at 300° C. or less, more preferably at 250° C. or less, and most preferably at 200° C. or less. In a temperature region exceeding 300° C., it may become difficult to control the orientation of the film, in particular, the orientation at the ends of the film by technique 3.

In step (D), the film shrinks to some degree by rapid heating. When the tension in the TD direction is substantially zero at the entry of the furnace during the transfer of the fixed film, the thermal shrinkage of the film decreases the film width. As a result, the distance between the fixing units becomes the same as the width of the film between the fixing units, and a wrinkle-free film is produced thereby.

The heating furnace suitable for the present invention is either a heating furnace in which hot air of 100° C. or higher is blasted toward the entire film from the upper surface, the lower surface, or the both surfaces of the film, or a far-infrared heating furnace equipped with a far-infrared radiator that bakes the film with irradiation of far-infrared rays. The film is preferably baked by increasing the temperature stepwise. Thus, it is preferable to use a stepwise heating system combining hot-air furnaces, far-infrared heating furnaces, or both hot-air furnaces and far-infrared heating furnaces. In order not to transmit heat from one furnace to the next, a unit for dividing the furnaces is preferably provided.

In the baking process described above, the heating temperature first applied to the gel film transferred into the furnace while fixing the ends is preferably 100° C. to 250° C. and more preferably 120° C. to 200° C. to make an organic insulating film having molecules oriented in the MD direction. In particular, two or more heating furnaces are preferably provided, and the temperature of the first heating furnace is preferably adjusted to 100° C. to 250° C. If the process is applied to make an organic insulating film of a different material, the temperature is preferably adjusted by taking into account the type of the organic insulating film and the volatilization temperature of the solvent. In particular, the boiling point of the main solvent contained in the gel film should be investigated, and the temperature is preferably controlled within (boiling point of the solvent −100° C.) to (boiling point of the solvent +100° C.).

In making the polyimide film, when the temperature first applied to the gel film transferred into the furnace is higher than 250° C., a bowing phenomenon occurs and it frequently becomes difficult to control the orientation axes in the ends of the film. Here, "bowing phenomenon" refers to development of higher molecular orientation tendencies at the end portions of the film caused by the film contraction which causes the center portion of the film to be transferred into the furnace ahead of the end portions of the film. When the temperature first applied is less than 100° C., a polyimide film having controlled molecular orientation axes can be produced by setting the temperature in the next furnace to 100° C. to 250° C. Although it is preferable to control the temperatures of the first furnace and the second furnace as described above, the temperatures of other furnaces are preferably controlled to the baking temperature typically employed in the production of the polyimide films.

The tension applied in the MD direction to the gel film transferred into the furnace is calculated as the tension applied per meter of the film. The tension is preferably 1 to 20 kg/m, and more preferably 1 to 15 kg/m. At a tension less than 1 kg/m, stable transfer of the film is difficult, and stable production of the film by holding the film may be difficult. At a tension exceeding 20 kg/m, control of the molecular orientation in the MD direction at the ends of the film may become difficult.

Examples of the device for applying tension to the gel film transferred into the furnace include loading rollers that apply loads to the gel film, rollers that apply variable loads by selecting the rotating speed, and nip rollers for controlling the tension by clamping the gel film with two rollers. Tension applied to the gel film can be adjusted using above devices.

The tension is preferably adequately adjusted within the above-described range according to the thickness of the polyimide film. The film thickness is preferably 1 to 200 μm and more preferably 1 to 100 μm.

Step (D) may also include step (D-2) of stretching the film in the TD direction.

In this invention, step (D-2) of stretching the film in the TD direction is conducted in the heating furnace after step (D-1). In step (D-1), the film is fixed so that substantially no tension is applied to the film width direction (TD direction) and is transferred. The film heated in the furnace undergoes some degree of shrinking, which eliminates the relaxation of the film. The film is then stretched in the TD direction. The amount of stretch (here, this is referred to as "expansion ratio" for sake of simplicity) preferably satisfies the relationship (4):

$$40.0 \geq (C-B)/B \times 100 > 0.00 \tag{4}$$

wherein B is the distance between the fixed ends in the TD direction before the stretching and C is the distance between the fixed ends after the stretching in the TD direction (refer to FIG. 2).

When $(C-B)/B \times 100$ (sometimes referred to as "TD expansion ratio") is beyond the above-described range, it may become difficult to control the molecular orientation axis of the film in the MD direction. More preferably, the relationship $30.0 \geq (C-B)/B \times 100 > 0.00$ is satisfied, and most preferably the relationship $20.0 \geq (C-B)/B \times 100 > 0.00$ is satisfied.

In step (D-2), the film may be stretched in the TD direction by gradually increasing the distance between the fixing units. If necessary, shrinking may again be performed or the film width may be further increased after step (D-2). The amounts of contraction and expansion are preferably adequately selected.

In producing a synthetic resin film that undergoes a decrease in the elastic modulus at high temperatures, the film is preferably stretched at a temperature of step (D-2) that is the temperature causing a change in the elastic modulus ±100° C. In particular, the temperature is preferably 300° C. to 500° C. to prepare a polyimide film having high heat resistance. In particular, the temperature is preferably in the range of 350° C. to 480° C. so that the elastic modulus of the polyimide film is low and the film is easy to stretch. In the above-described temperature range, the synthetic resin film may soften and may be excessively stretched by the transfer inside the furnace. In such a case, the temperature range other than ones above is preferably selected.

In order to identify the temperature at which the elastic modulus of the film is decreased, a common storage elastic modulus analyzer is used. The storage elastic modulus of the film with respect to temperature is measured with the analyzer. Either the temperature at which the film is completely melted after starting to decrease in the storage modulus or the temperature at which the storage elastic modulus becomes constant after starting to decrease in the modulus is preferably defined as the temperature at which the elastic modulus of the film is decreased.

In this invention, a film having molecules oriented in the MD direction may be produced by adequately adjusting the shrinking in step (D-1), stretching in step (D-2), film tension in the MD direction during the transfer, the content of the residual components in the gel film, and the heating temperatures. When a polyimide film is to be formed, the heating temperature and heating time of the film completely differ depending on whether chemical imidization or thermal imidization is conducted. A target film can still be obtained by thermal imidization by controlling the process according to the present invention.

(II) Adhesive Layer Containing Thermoplastic Polyimide

The thermoplastic polyimide contained in the adhesive layer of the adhesive film of the present invention is preferably a thermoplastic polyimide, a thermoplastic polyamide-imide, a thermoplastic polyetherimide, or thermoplastic polyesterimide. A thermoplastic polyesterimide having a low moisture absorption property is particularly preferable.

The thermoplastic polyimide used in the present invention preferably has a glass transition point (Tg) in the range of 150° C. to 300° C. so that lamination with a conventional apparatus is possible and that the heat resistance of the resulting metal-clad laminate is not degraded. The glass transition point can be determined from the inflection point of storage elastic modulus observed with a dynamic viscoelastic measuring analyzer (DMA)

The thermoplastic polyimide is prepared by imidizing a polyamic acid, which is a precursor. The precursor of the thermoplastic polyimide is not particularly limited, and any known polyamic acid may be used. Known starting materials, reaction conditions, and the like may be used for the production. If necessary, an organic or inorganic filler may be added.

(III) Production of Adhesive Film

The adhesive film of the present invention is produced by providing an adhesive layer containing a thermoplastic polyimide to at least one surface of a particular polyimide film produced by the above-described continuous process. Examples of the preferable methods include a method of forming an adhesive layer on a polyimide film, which is a base film, and a method of bonding a sheet of an adhesive layer onto the polyimide film. According to the former method, complete imidization of the polyamic acid (thermoplastic polyimide precursor) contained in the adhesive layer may decrease the solubility in the organic solvent. Thus, it may become difficult to form the adhesive layer on the polyimide film. Accordingly, a solution containing a polyamic acid (thermoplastic polyimide precursor) is preferably applied onto the base film, and then imidization is performed.

The method for flow-casting or applying the polyamic acid solution onto the polyimide film is not particularly limited. A conventional method such as die coating, reverse coating, or blade coating may be employed. The effects of the present invention are particularly noticeable when the adhesive layer is formed by a continuous process. In detail, the polyimide film may be wound into a roll and then unreeled while the polyamic acid (precursor)-containing solution is continuously applied onto the polyimide film. The polyamic acid solution may contain other components, such as a filler, depending on the usage.

The thickness of each layer of the heat resistant adhesive film can be adequately adjusted so that the total thickness is optimum for the usage. If necessary, surface treatment, such as corona discharge treatment, plasma-enhanced treatment, or coupling treatment may be performed on the surface of the core film before formation of the adhesive layer.

As the process for imidization of thermoplastic polyimide, a thermal cure technique or a chemical cure technique may be employed. In both techniques, heating is performed to efficiently conduct the imidization. The temperature is preferably set in the range of Tg of thermoplastic polyimide −100°

C. to Tg of thermoplastic polyimide +200° C. and more preferably in the range of Tg of thermoplastic polyimide −50° C. to Tg of thermoplastic polyimide +150° C.

As imidization by the thermal curing readily occurs at a high temperature, and the curing rate can be increased, which is preferable from the standpoint of productivity. However, at an excessively high temperature, the thermoplastic polyimide may become thermally decomposed.

The imidization time should be long enough to substantially finish imidization and drying and is not particularly defined. Typically, the imidization time is set in the range of about 1 to 600 seconds. In order to improve the melt flowability of the adhesive layer, the imidization ratio may be intentionally decreased and/or the solvent may be intentionally left.

The tension applied during the imidization is 1 to 15 kg/m and preferably 3 to 10 kg/m in the MD direction when the thickness of the film is 25 μm. When the tension is below the range, the film may sag during the transfer and may not be uniformly wound into a roll. If the thickness must be changed, the tension should be adjusted accordingly. When the tension is over the above-described range, the film is heated to a high temperature while high tension is being applied to the adhesive film. Thus, even when the core film is oriented in the MD direction, thermal stress will be generated in the adhesive film, thereby adversely affecting dimensional changes.

The thickness of the adhesive layer is preferably 0.5 μm to 10 μm from the standpoints of the heat resistance, bending resistance, and adhesiveness.

The variation in thickness of the adhesive layer preferably satisfies the relationship below:

$$0.7T > T > 1.3T$$

wherein T is a target thickness. When the variation in thickness is beyond this range, the coefficient of linear expansion of the adhesive film changes and the variation in dimensional change of the FCCL is adversely affected.

(IV) Flexible Metal-Clad Laminate and Method for Producing the Laminate

The flexible metal-clad laminate of the present invention is produced by bonding a metal foil onto the adhesive film described above. The type of metal foil is not particularly limited. When the flexible metal-clad laminate is used in electronic and electrical device applications, foils composed of copper, a copper alloy, stainless steel, a stainless steel alloy, nickel, a nickel alloy (including alloy 42), aluminum, or an aluminum alloy may be used.

Typical metal-clad laminates frequently use copper foils such as rolled copper foils and electrolytic copper foils. They are also preferable in the present invention. The surface of the metal foil may be coated with an antirust layer, a heat-resistant layer, or the like or may be treated with a coupling agent or the like to improve the adhesiveness. In the present invention, the thickness of the metal foil is not particularly limited. The thickness should be adjusted so that sufficient functions suitable for the use can be exhibited.

The effects of the inventive adhesive film are particularly noticeable when the bonding of the metal foil onto the base film is conducted by a continuous process using a hot roll laminator including one or more pairs of metal rollers or a double belt press (DBP).

The adhesive film may be slit into a film having an adequate width and then bonded with the metal foil in the continuous process. The effects of the present invention are particularly noticeable when the film width is 250 mm or more since the ratio of dimensional change is decreased and is stable across the entire width.

The bonding of the metal layer is preferably conducted with a hot roll laminator including one or more pairs of metal rollers, since the hot roll laminator has a simple configuration and requires low maintenance cost.

When the hot roll laminator is used, the dimensions of the film easily change. The adhesive film of the present invention is particularly advantageous when bonding is conducted with a hot roll laminator having one or more pairs of metal rollers. Here, "hot roll laminator having one or more pairs of metal rollers" may be any device equipped with metal rollers for heating and pressing a work piece, and the structure of the device is not particularly limited.

The specific process for conducting the thermal lamination is not particularly limited. In order to improve appearance of the resulting laminate, a protective material is preferably interposed between the film surface and the metal foil. The protective material may be any material that can withstand the heating temperature during the thermal lamination. Examples thereof include heat-resistant plastics, such as non-thermoplastic polyimide films, and metal foils such as copper foils, aluminum foils, and stainless steel foils. Among these, non-thermoplastic polyimide films are preferable from the standpoint of good balance between the heat resistance and recyclability.

The thickness of the non-thermoplastic polyimide film is preferably 75 μm or more since an excessively thin film does not exhibit sufficient cushioning and protecting effects during the lamination.

The protective material need not be a single layer and may have a multilayer structure constituted from two or more layers having different properties.

In the thermal lamination, the method for heating the materials to be laminated is not particularly limited. A known heating method that can heat the material at a predetermined temperature can be used. Examples of such a method include a heat circulation method, a hot-air heating method, and an induction heating method. The method for pressuring the material to be laminated in the thermal lamination is also not particularly limited and any conventional technique that can apply a predetermined pressure can be employed. Examples thereof include a hydraulic method, an air pressure method, and a gap-frame pressing method.

The heating temperature during the thermal lamination, i.e., the lamination temperature, is preferably at least 50° C. higher and more preferably at least 100° C. higher than the glass transition point (Tg) of the adhesive film. At a temperature of Tg +50° C. or higher, the adhesive film can be satisfactorily thermally laminated with the metal foil.

At a temperature of Tg +100° C. or higher, the lamination speed can be increased to further increase the productivity.

The effects of the present invention are particularly notable when the heating temperature is 200° C. or more and preferably 300° C. or more. In general, when a thermoplastic polyimide is used in the adhesive layer, a temperature as high as 200° C. or more or, in some cases, near 400° C. must be applied to yield heat bondability. Thus, residual strain is generated in the flexible metal-clad laminate prepared by the lamination, and dimensions change during etching for forming wiring or during solder reflow for mounting a component. In contrast the inventive adhesive film includes a polyimide film having particular physical properties across the entire width. Thus, even when lamination is conducted at high temperature, the ratio of dimensional change is small, and a flexible metal-clad laminate having a stable ratio of dimensional change across the entire width can be obtained.

The lamination speed during the above-described thermal lamination step is preferably 0.5 m/min or more and more preferably 1.0 m/min or more. At a speed of 0.5 m/min or more, sufficient thermal lamination is possible. At speed of 1.0 m/min or more, the productivity can be further improved.

As the pressure during the thermal lamination step, i.e., the lamination pressure, increases, the required lamination temperature decreases and the lamination speed increases. At an excessively high lamination pressure, however, the dimensional changes of the laminate obtained thereby may become greater. At an excessively low lamination pressure, the bonding strength between the metal foil and the thermoplastic polyimide may be decreased.

Accordingly, the lamination pressure is preferably in the range of 49 to 490 N/cm (5 to 50 kgf/cm) and more preferably in the range of 98 to 294 N/cm (10 to 30 kgf/cm). Within these ranges, the three conditions, i.e., the lamination temperature, the lamination speed, and the lamination pressure, can be adjusted to satisfactory levels, and the productivity can be further increased.

The tension applied to the adhesive film during the lamination step is preferably 0.01 to 4 N/cm, more preferably 0.02 to 2.5 N/cm, and most preferably 0.05 to 1.5 N/cm. At a tension below this range, the film may sag or meander during the transfer for the lamination and may not be sent to the heating rollers in a uniform manner. Thus, it may be difficult to obtain a flexible metal-clad laminate having good appearance.

At a tension above this range, the influence of the tension is so strong that it cannot be moderated by controlling the glass transition point and the storage elastic modulus of the adhesive layer. Thus, the dimensional stability may be decreased.

In order to produce the inventive flexible metal-clad laminate, a thermal laminator that can continuously press while heating the materials to be laminated is preferably used. In the thermal laminator, a lamination material feeding unit for feeding the materials to be laminated may be provided in the previous step of the thermal laminator, and a lamination material wind-up unit for winding up the materials to be laminated may be provided in the subsequent step of the thermal laminator. Providing these units can help further increase the productivity of the thermal laminator. The configurations of the lamination material feeding unit and the lamination material wind-up unit are not particularly limited and include for example, any known roll-shaped wind-up machine that can windup an adhesive film, a metal foil, or a resulted laminated product can be used.

More preferably, a protective material wind-up unit and a protective material feeding unit for winding and feeding a protective material are provided. With these units, the protective material used once in the thermal lamination process can be reused by winding-up the protective material, and then setting it to the feeding site of the feeding unit. In order to align the ends of the protective material during the wind-up operation, an end position detecting unit and a wind-up position correcting unit may be provided.

According to these units, the protective material can be wound up accurately aligning the ends thereof, thereby increasing the recycling efficiency. The configurations of the protective material wind-up unit, the protective material feeding unit, the end position detecting unit, and the wind-up position correcting unit are not particularly limited. Various known apparatuses may be used.

With respect to the flexible metal-clad laminate obtained by the inventive production method, the total of the ratio of dimensional change before and after the removal of the metal foil and the ratio of dimensional change before and after 30 minutes of heating at 250° C. conducted after the metal foil removal is particularly preferably in the range of −0.4 to +0.4 in both MD and TD directions. The ratio of dimension change before and after the removal of the metal foil is defined as a ratio of the difference between a particular dimension of the flexible metal-clad laminate before etching and the dimension after the etching to the particular dimension of the flexible metal-clad laminate before the etching. The ratio of dimensional change before and after the heating is defined as a ratio of the difference between a particular dimension of the flexible meta-clad laminate before the heating and the dimension after the heating to the particular dimension of the flexible metal-clad laminate before the heating.

When the ratio of dimensional change is outside this range, the resulting flexible metal-clad laminate may undergo substantially large dimensional changes when fine wiring is formed and when a component is mounted thereon. Thus, the position for mounting the component may deviate from the designed position. As a consequence, a substrate may not satisfactorily couple with a component mounted thereon. In other words, by adjusting the ratio of dimensional change in the above-described range, it becomes possible to assume that the laminate is suitable for mounting components.

The technique of measuring the ratio of dimensional change is not particularly limited. Any known method that can measure the increase or decrease that occurs before and after the etching or heating of the flexible metal-clad laminate may be employed.

The ratio of dimensional change must be measured in both the MD and TD directions. When imidization and lamination are conducted continuously, the tension applied in the MD direction differs from that applied in the TD direction. Thus, the degree of thermal expansion and contraction in the MD direction differs from that in the TD direction, and the same applies to the ratio of dimensional change. Thus, in a material having a ratio of dimensional change the ratio of change must be small in both the MD and TD directions. In this invention, the total of the ratio of dimensional change before and after the removal of the flexible metal foil and the ratio of dimensional change before and after 30 minutes of heating at 250° C. conducted after the metal foil removal is particularly preferably in the range of −0.4 to +0.4 in both the MD and TD directions.

The conditions of the etching step for the measurement of the ratio of dimensional change are not particularly limited. Etching conditions vary depending on the type of metal foil, the shape of the patterned wiring, and the like. That is, in the invention, the conditions of the etching for the measurement of the ratio of dimensional change may be any known conditions. Similarly, in the heating step, the conditions are not particularly limited as long as heating is conducted at 250° C. for 30 minutes.

The flexible metal-clad laminate obtained by the method of the present invention can be used as a flexible wiring board having miniaturized components mounted thereon at high density. This is done by etching the metal foil of the flexible metal-clad laminate to form a desired patterned wiring, as described above. It is needless to say that the application of the present invention is not limited to this. The present invention can be applied to any usage that requires a laminate including a metal foil.

EXAMPLES

The present invention will now be described by way of examples. It should be understood that the examples in no way limit the scope of the invention.

1. Evaluation Methods

In SYNTHETIC EXAMPLES, EXAMPLES, and COMPARATIVE EXAMPLES, the glass transition temperature of the thermoplastic polyimide, the elastic modulus and coefficient of linear expansion of the polyimide film, and the ratio of dimensional change of the flexible metal-clad laminate were evaluated as follows.

(1) Thermoplastic Polyimide (Glass Transition Temperature)

The glass transition temperature was measured with DMS200 produced by Seiko Instruments Inc., at a heating rate of 3° C./min in the temperature range of room temperature to 400° C. (measurement frequency: 5 Hz), and the glass transition temperature was defined as the inflection point of the storage elastic modulus.

(2) Polyimide Film (Elastic Modulus)

Five strip measurement samples (15 mm×200 mm) were cut out from a film in the longitudinal direction and in a direction (width direction) perpendicular to the longitudinal direction. The elastic modulus of each sample was measured according to the standard D882 of ASTM.

(Coefficient of Linear Expansion)

The coefficient of linear expansion of the adhesive film was determined using a thermomechanical analyzer TMA120C produced by Seiko Instruments Inc. A sample was heated under a nitrogen stream at a heating rate of 10° C./min for the temperature range of 10° C. to 400° C. during which the coefficient of linear expansion was measured. Then the sample was cooled to room temperature, and was heated under a nitrogen stream at a heating rate of 10° C./min for the temperature range of 10° C. to 400° C. during which the coefficient of linear expansion was measured. The observed values in the temperature range of 100° C. to 200° C. were averaged. The measurement was conducted in both the MD and TD directions.

(3) Flexible Metal-Clad Laminate (Ratio of Dimensional Change)

Four holes were formed in a flexible metal-clad laminate according to Japanese Industrial Standards (JIS) C6481 5.16, and the distances between the holes were measured.

The film with holes was then etched to remove the metal foil from the flexible laminate, and the resulting film was left to stand in a thermostatic chamber at 20° C. and 60% RH for 24 hours.

The distances between the four holes were measured in the same manner as before the etching.

The ratio of dimensional change was calculated based on the equation below:

$$\text{ratio of dimension change (\%)} = \{(D2 - D1)/D1\} \times 100$$

wherein D1 is the observed distance between the holes before the removal of the metal foil and D2 is the observed distance between the holes after the removal of the metal foil. Next, the sample after etching was heated at 250° C. for 30 minutes and then left to stand in a thermostatic chamber at 20° C. and 60% RH for 24 hours. The distances between the four holes were measured. The ratio of dimensional change before and after the heating was determined by the following equation:

$$\text{ratio of dimension change (\%)} = \{(D3 - D2)/D2\} \times 100$$

wherein D3 is the distance between the holes after the heating.

The ratio of dimensional change was measured in both the MD and TD directions.

Synthetic Example 1

Production of Polyimide Film

Pyromellitic dianhydride, 4,4'-oxydianiline, and p-phenylenediamine were polymerized at a molar ratio of 1/0.75/0.25 in an N,N'-dimethylacetamide solvent so that the solid content was 18%.

To be more specific, 75 mol % of 4,4'-oxydianiline relative to the total diamine content was dissolved in an N,N'-dimethylacetamide solvent, and the total amount of pyromellitic dianhydride (i.e., 133% of acid anhydride relative to the diamine component already added) was added thereto to prepare an acid-terminated prepolymer.

Next, the acid-terminated prepolymer solution was combined with the rest of the diamine component (i.e., the p-phenylenediamine) so that the diamine component was substantially equimolar with the total of the acid component, and the resulting mixture was reacted to obtain a polymer solution.

The polymer solution was cooled to about 0° C. and combined with 2.0 mol % of acetic anhydride and 0.5 mol % of isoquinoline per mole of amic acid in the polyamic acid organic solvent solution cooled to about 0° C. The resulting mixture was thoroughly stirred, extruded from a die, and applied on an endless belt by flow casting as to form the layer with a thickness of 25 μm after drying and baking. The applied solution was heated on the endless belt to obtain a gel film having a residual component content of 30 wt %.

The gel film was peeled off, and the two ends of the film were fixed onto pin seats for continuously transferring the film. The fixed gel film was transferred into a hot air furnace and heated at 250° C. for 20 seconds. Then the resulting film was transferred to and heated in a hot-air furnace at 350° C. for 20 seconds and then in another hot-air furnace at 400° C. for 20 seconds. The resulting film was next heated in a far-infrared heating furnace (hereinafter "far-infrared furnace") at 350° C. for 20 seconds and transferred to a slow-cooling zone. The film passed through the slow-cooling zone was released from the pins and wound into a roll to obtain a film with ends fixed (a long film) having a width of about 1 m and a thickness of 25 μm produced.

The film was subjected to applying heat and tension as a post treatment in a hot-air/far-infrared furnace while controlling the tension by a roll-to-roll technique. The retention time in the furnace was 50 seconds, the furnace temperature was 500° C., and the tension was 0.51 kg/mm².

Synthetic Example 2

Production of Polyimide Film

A polyimide film was produced by applying heat and tension in the hot-air/far-infrared furnace while controlling the tension by a roll-to-roll technique as in SYNTHETIC EXAMPLE 1 but except that tensions and heating conditions were changed as shown in Table 1.

Synthetic Example 3

Production of Polyimide Film

Pyromellitic dianhydride, p-phenylene bis(trimellitic acid monoester anhydride), 4,4'-diaminodiphenyl ether, and p-phenylenediamine at a molar ratio of 1/1/1/1 were polymerized in an N,N'-dimethylacetamide solvent so that the solid content was 18%.

The polymer solution was cooled to about 0° C. and combined with 2.1 mol % of acetic anhydride and 1.1 mol % of isoquinoline per mole of amic acid in the polyamic acid organic solvent solution cooled to about 0° C. The resulting mixture was thoroughly stirred, extruded from a die maintained at about 5° C., and applied on an endless belt by flow casting to heat and dry the cast solution. A gel film having a residual component content of 60 wt % was obtained as a result.

The resulting self-supporting green sheet (gel film) was peeled off and the ends thereof were fixed onto pin seats for continuously transferring the film. The film was then transferred through hot air furnaces, a far-infrared furnace, and a slow-cooling furnace. After the film was discharged from the slow-cooling furnace, the film was released from the pins and wound into a roll to obtain a polyimide film having a width of about 1.0 m and a thickness of 18 μm.

The atmospheric temperatures and the retention times in the heating furnaces (furnaces 1 to 4), the far-infrared furnace, and the slow-cooling furnace are shown in Table 3. The contraction ratios and the expansion ratios (referred to as contraction/expansion ratios in the table) are also shown in Table 3. The process of reducing the distance between the fixed ends so that substantially no tension was applied to the film in the TD direction was completed before the film was transferred into the furnace. The process of increasing the distance between the fixed ends was conducted in the furnace 4. In the table, "IR furnace" indicates a far-infrared furnace.

Synthetic Example 4

Production of Polyimide Film

Pyromellitic dianhydride, p-phenylene bis(trimellitic acid monoester anhydride), 4,4'-diaminodiphenyl ether, and p-phenylenediamine at a molar ratio of 1/1/1/1 were polymerized in an N,N'-dimethylacetamide solvent so that the solid content was 18%.

The polymer solution was cooled to about 0° C. and combined with 2.1 mol % of acetic anhydride and 1.1 mol % of isoquinoline per mole of amic acid in the polyamic acid organic solvent solution cooled to about 0° C. The resulting mixture was thoroughly stirred, extruded from a die maintained at about 5° C., and applied on an endless belt by flow casting to heat and dry the solution. A gel film having a residual component content of 60 wt % was obtained as a result.

The resulting self-supporting green sheet (gel film) was peeled off and the ends thereof were fixed onto pin seats for continuously transferring the film. The film was then transferred through hot air furnaces, a far-infrared furnace, and a slow-cooling furnace. After the film was discharged from the slow-cooling furnace, the film was released from the pins and wound into a roll to obtain a polyimide film having a width of about 1.0 m and a thickness of 18 μm.

The atmospheric temperatures and the retention times in the heating furnaces (furnaces 1 to 3), the far-infrared furnace, and the slow-cooling furnace are shown in Table 4. The contraction/expansion ratios are also shown in Table 4. The process of reducing the distance between the fixed ends so that substantially no tension was applied to the film in the TD direction was completed before the film was transferred into the furnace. The process of increasing the distance between the fixed ends was conducted in the furnace 3. In the table, "IR furnace" indicates a far-infrared furnace.

Synthetic Example 5

Production of Polyimide Film

Pyromellitic dianhydride, 4,4'-oxydianiline, and p-phenylenediamine at a molar ratio of 1/0.75/0.25 were polymerized in an N,N'-dimethylacetamide solvent so that the solid content was 18%.

In detail, 75 mol % of 4,4'-oxydianiline relative to the total diamine content was dissolved in an N,N'-dimethylacetamide solvent, and the total amount of pyromellitic dianhydride (i.e., 133% of acid anhydride relative to the diamine component already added) was added thereto to prepare an acid-terminated prepolymer. The acid-terminated prepolymer solution was combined with the rest of the diamine component (i.e., p-phenylenediamine) so that the diamine component was substantially equimolar with the total of the acid component, and the resulting mixture was reacted to obtain a polymer solution.

The polymer solution was cooled to about 0° C. and combined with 2.0 mol % of acetic anhydride and 0.5 mol % of isoquinoline per mole of amic acid in the polyamic acid organic solvent solution cooled to about 0° C. The resulting mixture was thoroughly stirred, extruded from a die, and applied on an endless belt by flow casting such that the layer of the applied solution would have a thickness of 25 μm after drying and baking. The applied solution was heated on the endless belt to obtain a gel film having a residual component content of 30 wt %.

The gel film was peeled off and the ends thereof were fixed onto pin seats for continuously transferring the film. The film was then transferred to and heated in a hot air furnace at 250° C. for 20 seconds, in a hot-air furnace at 350° C. for 20 seconds, and then in a hot-air furnace at 400° C. for 20 seconds. The resulting film was transferred to a far-infrared heating furnace to be heated at 530° C. for 20 seconds. After the film was discharged from a slow-cooling zone, the film was released from the pins and wound into a roll to obtain a film with ends fixed (a long film) having a width of about 1 m and a thickness of 25 μm produced.

Synthetic Example 6

Production of Polyimide Film

A film was prepared as in SYNTHETIC EXAMPLE 4 except that expansion/contraction ratios and heating conditions were changed as shown in Table 4.

Synthetic Example 7

Synthesis of Thermoplastic Polyimide Precursor

Into a 2,000 mL glass flask, 780 g of DMF and 115.6 g of 2,2-bis[4-(4-aminophenoxy)phenyl]propane (hereinafter also referred to as BAPP) were introduced, and the resulting mixture was stirred under a nitrogen atmosphere while 78.7 g of BPDA was gradually added thereto. Subsequently, 3.8 g of ethylene glycol bistrimellitic dianhydride (TMEG) was added to this reaction solution, and the mixture was stirred for 30 minutes in an ice bath. A solution of 2.0 g of TMEG in 20 g of DMF was separately prepared, and this solution was gradually added to the reaction solution while monitoring the viscosity under stirring. The addition and the stirring were discontinued after the viscosity reached 3,000 poise. A polyamic acid solution (thermoplastic polyimide precursor) was obtained as a result.

The glass transition temperature of the polyimide polymer prepared from the resulting polyamic acid solution was determined as follows. The polyamic acid solution thus prepared was flow-cast onto a 25-μm PET film (Cerapeel HP, produced by Toyo Metallizing Co., Ltd.) so that the final thickness was 20 μm, and dried at 120° C. for 5 minutes. The resulting self-supporting film after the drying was peeled off from the PET film, fixed onto a metal pin frame, and dried at 150° C. for 5 minutes, at 200° C. for 5 minutes, at 250° C. for 5 minutes, and at 350° C. for 5 minutes. The glass transition temperature of the single-layer sheet thus obtained was measured. The glass transition temperature of was 240° C.

Synthetic Example 8

Production of Polyimide Film

Pyromellitic dianhydride, p-phenylene bis(trimellitic acid monoester anhydride), 4,4'-diaminodiphenyl ether, and p-phenylenediamine at a molar ratio of 1/1/1/1 were polymerized in an N,N'-dimethylformamide solvent so that the solid content was 18%.

The polymer solution was cooled to about 0° C. and combined with 1.6 mol % of acetic anhydride and 0.8 mol % of isoquinoline per mole of amic acid in the polyamic acid organic solvent solution cooled to about 0° C. The resulting mixture was thoroughly stirred, extruded from a die maintained at about −5° C., and applied on an endless belt by flow casting. The applied solution was heated at 140° C. or less on the endless belt to prepare a gel film having a residual component content of 60 wt %. The resulting self-supporting green sheet (gel film) was peeled off and the ends thereof were fixed onto pin seats for continuously transferring the film. The film was then transferred through hot air furnaces, a far-infrared furnace, and a slow-cooling furnace. After the film was discharged from the slow-cooling furnace, the film was released from the pins and wound on a roll to obtain a polyimide film having a width of about 1.5 m and a thickness of 18 μm.

The atmospheric temperatures and the retention times in the heating furnaces (furnaces 1 to 3), the far-infrared furnace, and the slow-cooling furnace are shown in Table 8. The contraction ratios and the expansion ratios (referred to as contraction/expansion ratios in the table) are also shown in Table 8.

A minus contraction/expansion ratio indicates that the film is relaxed in the TD direction at the entry of the furnace. A plus contraction/expansion ratio indicates that the film is being stretched.

Synthetic Example 9

Production of Polyimide Film

A polyimide film was prepared as in SYNTHETIC EXAMPLE 8 except that the contraction/expansion ratios and the heating conditions were changed as in Table 8.

Synthetic Example 10

Production of Polyimide Film

A polyimide film was prepared as in SYNTHETIC EXAMPLE 8 except that the contraction/expansion ratios and the heating conditions were changed as in Table 9.

Synthetic Example 11

Production of Polyimide Film

A polyimide film was prepared as in SYNTHETIC EXAMPLE 8 except that the contraction/expansion ratios and the heating conditions were changed as in Table 8.

Synthetic Example 12

Production of Polyimide Film

Pyromellitic dianhydride, p-phenylene bis(trimellitic acid monoester anhydride), 4,4'-diaminodiphenyl ether, and p-phenylenediamine at a molar ratio of 1/1/1/1 were polymerized in an N,N'-dimethylacetamide solvent so that the solid content was 18%.

The polymer solution was cooled to about 0° C. and combined with 1.6 mol % of acetic anhydride and 0.8 mol % of isoquinoline per mole of amic acid in the polyamic acid organic solvent solution cooled to about 0° C. The resulting mixture was thoroughly stirred, extruded from a die kept at about −5° C., and applied on an endless belt by flow casting. The applied solution was heated at 140° C. or less on the endless belt to prepare a gel film having a residual component content of 28%. The resulting self-supporting green sheet (gel film) was peeled off from the support and the ends thereof were fixed onto pin seats for continuously transferring the film. The film was then transferred through hot air furnaces, a far-infrared furnace, and a slow-cooling furnace. After the film was discharged from the slow-cooling furnace, the film was released from the pins and wound into a roll to obtain a polyimide film having a width of about 1.5 m and a thickness of 18.5 μm. The film was subjected to stretching as a post treatment in the MD direction under heating in an IR furnace by a roll-to-roll technique, to obtain a film.

The atmospheric temperatures and the retention times in the heating furnaces (furnaces 1 to 3), the far-infrared furnace, and the slow-cooling furnace are shown in Table 3. The conditions of stretching as a post treatment under heating, are shown in Table 10.

Synthetic Example 13

Production of Polyimide Film

A polyimide film was prepared as in SYNTHETIC EXAMPLE 8 except that the contraction/expansion ratios and the heating conditions were changed as in Table 9.

Synthetic Example 14

Production of Polyimide Film

A polyimide film was prepared as in SYNTHETIC EXAMPLE 12 except that the conditions of heating and applying tension in the hot-air/far-infrared furnace while controlling the tension by a roll-to-roll technique (post-treatment) were changed as shown in Table 10.

Synthetic Example 15

Synthesis of Thermoplastic Polyimide Precursor)

Into a 2,000 mL glass flask, 780 g of DMF and 115.6 g of 2,2-bis[4-(4-aminophenoxy)phenyl]propane (hereinafter also referred to as BAPP) were introduced, and the resulting mixture was stirred under a nitrogen atmosphere while 78.7 g of BPDA was gradually added thereto. Subsequently, 3.8 g of TMEG was added to this reaction solution, and the mixture was stirred for 30 minutes in an ice bath. A solution of 2.0 g of TMEG in 20 g of DMF was separately prepared, and this solution was gradually added to the reaction solution while monitoring the viscosity under stirring. The addition and the stirring were stopped after the viscosity reached 3,000 poise. A polyamic acid solution (thermoplastic polyimide precursor) was obtained as a result.

The glass transition temperature of the polyimide polymer prepared from the resulting polyamic acid solution was determined as follows. The polyamic acid solution thus prepared was flow-cast onto a 25-μm PET film (Cerapeel HP, produced by Toyo Metallizing Co., Ltd.) so that the final thickness was 20 μm, and dried at 120° C. for 5 minutes. The resulting self-supporting film after the drying was peeled off from the PET film, fixed onto a metal pin frame, and dried at 150° C. for 5 minutes, at 200° C. for 5 minutes, at 250° C. for 5 minutes, and at 350° C. for 5 minutes.

The single-layer sheet thus obtained was analyzed to determine the glass transition temperature. The glass transition temperature was 240° C.

Synthetic Example 16

Production of Polyimide Film

Pyromellitic dianhydride, 4,4'-oxydianiline, and p-phenylenediamine were polymerized at a molar ratio of 1/0.75/0.25 in an N,N'-dimethylacetamide solvent so that the solid content was 18%.

To be more specific, 75 mol % of 4,4'-oxydianiline relative to the total diamine content was dissolved in an N,N'-dimethylacetamide solvent, and the total amount of pyromellitic dianhydride (i.e., 133% of acid anhydride relative to the diamine component already added) was added thereto to prepare an acid-terminated prepolymer. Next, the acid-terminated prepolymer solution was combined with the rest of the diamine component (i.e., p-phenylenediamine) so that the diamine component was substantially equimolar with the total of the acid component, and the resulting mixture was reacted to obtain a polymer solution.

The polymer solution was cooled to about 0° C. and combined with 2.0 mol % of acetic anhydride and 0.5 mol % of isoquinoline per mole of amic acid in the polyamic acid organic solvent solution cooled to about 0° C. The resulting mixture was thoroughly stirred, extruded from a die, and applied on an endless belt by flow casting so that the layer of the applied solution would have a thickness of 25 μm after drying and baking. The applied solution was heated on the endless belt to obtain a gel film having a residual component content of 50 wt %. The gel film was peeled off, and the two ends of the film were fixed onto pin seats for continuously transferring the film. The fixed gel film was transferred into a hot air furnace and heated at 250° C. for 30 seconds. Then the resulting film was transferred to and heated in a hot-air furnace at 350° C. for 30 seconds and then in hot-air furnace at 400° C. for 30 seconds. The resulting film was next heated in a far-infrared heating furnace at 350° C. for 30 seconds and transferred to a slow-cooling zone. The film passed through the slow-cooling zone was released from the pins and wound into a roll to obtain a film with ends fixed (a long film) having a width of about 1 m and a thickness of 25 μm produced.

The film was subjected to applying heat and tension as a post treatment in a hot-air/far-infrared furnace while controlling the tension by a roll-to-roll technique. The retention time in the furnace was 30 seconds, the furnace temperature was 460° C., and the tension was 0.32 kg/mm$^2$.

Synthetic Example 17

Production of Polyimide Film

A polyimide film was prepared as in SYNTHETIC EXAMPLE 16 except that the conditions of applying heat and tension in a hot-air/far-infrared furnace while controlling the tension by a roll-to-roll technique (post-treatment) were changed as shown in Table 13.

Synthetic Example 18

Production of Polyimide Film

A polyimide film was prepared as in SYNTHETIC EXAMPLE 16 except that the conditions of applying heat and tension in a hot-air/far-infrared furnace while controlling the tension by a roll-to-roll technique (post-treatment) were changed as shown in Table 13.

Synthetic Example 20

Production of Polyimide Film

A polyimide film was prepared as in SYNTHETIC EXAMPLE 16 except that the conditions of applying heat and tension in a hot-air/far-infrared furnace while controlling the tension by a roll-to-roll technique (post-treatment) were changed as shown in Table 13.

Synthetic Example 19

Production of Polyimide Film

Pyromellitic dianhydride, 4,4'-oxydianiline, and p-phenylenediamine were polymerized at a molar ratio of 1/0.75/0.25 in an N,N'-dimethylacetamide solvent so that the solid content was 18%.

To be more specific, 75 mol % of 4,4'-oxydianiline relative to the total diamine content was dissolved in an N,N'-dimethylacetamide solvent, and the total amount of pyromellitic dianhydride (i.e., 133% of acid anhydride relative to the diamine component already added) was added thereto to prepare an acid-terminated prepolymer. Next, the acid-terminated prepolymer solution was combined with the rest of the diamine component (i.e., p-phenylenediamine) so that the diamine component was substantially equimolar with the total of the acid component, and the resulting mixture was reacted to obtain a polymer solution.

The polymer solution was cooled to about 0° C. and combined with 2.0 mol % of acetic anhydride and 0.5 mol % of isoquinoline per mole of amic acid in the polyamic acid organic solvent solution cooled to about 0° C. The resulting mixture was thoroughly stirred, extruded from a die, and applied on an endless belt by flow casting so that the layer of the applied solution would have a thickness of 25 μm after drying and baking. The applied solution was heated on the endless belt to obtain a gel film having a residual component content of 50 wt %.

The gel film was peeled off, and the two ends of the film were fixed onto pin seats for continuously transferring the film. The fixed gel film was transferred into a hot air furnace and heated at 250° C. for 30 seconds. Then the resulting film was transferred to and heated in a hot-air furnace at 350° C. for 30 seconds and then in another hot-air furnace at 400° C. for 30 seconds. The resulting film was next heated in a far-infrared heating furnace at 520° C. for 30 seconds and transferred to a slow-cooling zone. The film passed through the slow-cooling zone was released from the pins and wound into a roll to obtain a film with ends fixed (a long film) having a width of about 1 m and a thickness of 25 μm produced.

Synthetic Example 21
Synthesis of Thermoplastic Polyimide Precursor

Into a 2,000 mL glass flask, 780 g of DMF and 115.6 g of 2,2-bis[4-(4-aminophenoxy)phenyl]propane (hereinafter also referred to as BAPP) were introduced, and the resulting mixture was stirred under a nitrogen atmosphere while 78.7 g of BPDA was gradually added thereto. Subsequently, 3.8 g of ethylene glycol bistrimellitic dianhydride (TMEG) was added to this reaction solution, and the mixture was stirred for 30 minutes in an ice bath. A solution of 2.0 g of TMEG in 20 g of DMF was separately prepared, and this solution was gradually added to the reaction solution while monitoring the viscosity under stirring. The addition and the stirring were discontinued after the viscosity reached 3,000 poise. A polyamic acid solution (thermoplastic polyimide precursor) was obtained as a result.

The glass transition temperature of the polyimide polymer prepared from the resulting polyamic acid solution was determined as follows. The polyamic acid solution thus prepared was flow-cast onto a 25-μm PET film (Cerapeel HP, produced by Toyo Metallizing Co., Ltd.) so that the final thickness was 20 μm, and dried at 120° C. for 5 minutes. The resulting self-supporting film after the drying was peeled off from the PET film, fixed onto a metal pin frame, and dried at 150° C. for 5 minutes, at 200° C. for 5 minutes, at 250° C. for 5 minutes, and at 350° C. for 5 minutes. The glass transition temperature of the single-layer sheet thus obtained was measured. The glass transition temperature of was 240° C.

Example 1

The polyamic acid solution obtained in SYNTHETIC EXAMPLE 7 was diluted with DMF until the solid component content was 10 wt %. The polyamic acid was applied onto both surfaces of the polyimide film prepared in SYNTHETIC EXAMPLE 1 (film width: 1,000 mm) so that the final thickness of the thermoplastic polyimide layer (adhesive layer) was 4 μm on each surface. The adhesive film was then heated at 140° C. for 1 minute and passed through a far-infrared heating furnace at an atmospheric temperature of 390° C. for 20 seconds while applying a tension of 5 kg/m to form a thermally imidized adhesive film.

The adhesive film, 18-μm rolled copper foils (BHY-22B-T, produced by Japan Energy Corporation) on both surfaces of the adhesive film, and protective materials (Apical 125NPI produced by Kaneka Corporation) on both surfaces of the copper foils were thermally laminated a polyimide film tension of 0.4 N/cm, a lamination temperature of 360° C., a lamination pressure of 196 N/cm (20 kgf/cm), and a lamination speed of 1.5 m/min to prepare a flexible metal-clad laminate.

Example 2

An adhesive film and a flexible metal-clad laminate were prepared as in EXAMPLE 1 except that the polyimide film prepared in SYNTHETIC EXAMPLE 2 was used instead of the polyimide film prepared in SYNTHETIC EXAMPLE 1.

Example 3

The polyamic acid solution obtained in SYNTHETIC EXAMPLE 7 was diluted with DMF until the solid component content was 10 wt %. The polyamic acid was applied onto both surfaces of the polyimide film prepared in SYNTHETIC EXAMPLE 3 (film width: 1,000 mm) so that the final thickness of the thermoplastic polyimide layer (adhesive layer) was 4 μm on each surface. The film adhesive was then heated at 140° C. for 1 minute and passed through a far-infrared heating furnace at an atmospheric temperature of 390° C. for 20 seconds while applying a tension of 5 kg/m to form a thermally imidized adhesive film.

The adhesive film, 18-μm rolled copper foils (BHY-22B-T, produced by Japan Energy Corporation) on both surfaces of the adhesive film, and protective materials (Apical 12SNPI produced by Kaneka Corporation) on both surfaces of the copper foils were thermally laminated with a polyimide film tension of 0.4 N/cm, a lamination temperature of 360° C., a lamination pressure of 196 N/cm (20 kgf/cm), and a lamination speed of 1.5 m/min to prepare a flexible metal-clad laminate of the present invention.

Example 4

An adhesive film and a flexible metal-clad laminate were prepared as in EXAMPLE 3 except that the polyimide film prepared in SYNTHETIC EXAMPLE 4 was used instead of the polyimide film prepared in SYNTHETIC EXAMPLE 3.

Comparative Example 1

An adhesive film and a flexible metal-clad laminate were prepared as in EXAMPLE 1 except that the polyimide film prepared in SYNTHETIC EXAMPLE 5 was used instead of the polyimide film prepared in SYNTHETIC EXAMPLE 1.

Comparative Example 2

An adhesive film and a flexible metal-clad laminate were prepared as in EXAMPLE 3 except that the polyimide film prepared in SYNTHETIC EXAMPLE 6 was used instead of the polyimide film prepared in SYNTHETIC EXAMPLE 1.

The method of preparing samples for evaluating dimensional change of the flexible metal-clad laminates of EXAMPLES 1 to 4 and COMPARATIVE EXAMPLES 1 and 2 is shown in FIG. 3.

The production conditions of the films of SYNTHETIC EXAMPLES 1, 2, and 5 are shown in Table 1.

TABLE 1

| | Atmospheric temperature (upper column: temperature (° C.), lower column: retention time (sec)) | | | | Application of heat and tension | | | |
|---|---|---|---|---|---|---|---|---|
| | Furnace 1 | Furnace 2 | Furnace 3 | IR furnace | Temperature (° C.) | Retention time (sec) | Tension (kg/mm²) | Tension (kg/m) |
| SYN. EX. 1 | 250 20 | 350 20 | 400 20 | 350 20 | 500 | 50 | 0.51 | 12.7 |
| SYN. EX. 2 | 250 20 | 350 20 | 400 20 | 350 20 | 510 | 50 | 0.54 | 13.5 |
| SYN. EX. 5 | 250 20 | 350 20 | 400 20 | 530 20 | — | — | — | — |

*SYN. EX.: SYNTHETIC EXAMPLE

The observed coefficient of linear expansion of EXAMPLES 1 and 2 and COMPARATIVE EXAMPLE 1 are shown in Table 2.

TABLE 2

| | Coefficient of linear expansion | | Ratio of coefficient of linear expansion MD/TD |
|---|---|---|---|
| | MD | TD | |
| | ppm/° C. | | |
| EXAMPLE 1 | 16.7 | 37.8 | 0.44 |
| EXAMPLE 2 | 13.2 | 43.5 | 0.30 |
| COMP. EX. 1 | 26.3 | 23.7 | 1.11 |

*COMP. EX.: COMPARATIVE EXAMPLE

The production conditions of the film of SYNTHETIC EXAMPLE 3 are shown in Table 3.

TABLE 3

| | Atmospheric temperature (upper column: temperature (° C.), lower column: retention time (sec)) | | | | | | Expansion/contraction ratio (%) | | | | | |
|---|---|---|---|---|---|---|---|---|---|---|---|---|
| | Furnace 1 | Furnace 2 | Furnace 3 | Furnace 4 | IR furnace | Slow-cooling furnace | Furnace 1 | Furnace 2 | Furnace 3 | Furnace 4 | IR furnace | Slow-cooling furnace |
| SYN. EX. 3 | 130 | 250 | 350 | 450 | 510 | 480 450 350 200 | −1.9 | 0 | 0 | 4 | 0 | 0 |
| | 60 | 60 | 60 | 60 | 70 | | | | | | | |

*SYN. EX.: SYNTHETIC EXAMPLE

The production conditions of the films of SYNTHETIC EXAMPLES 4 and 6 are shown in Table 4.

TABLE 4

| | Atmospheric temperature (upper column: temperature (° C.), lower column: retention time (sec)) | | | | | Expansion/contraction ratio (%) | | | | |
|---|---|---|---|---|---|---|---|---|---|---|
| | Furnace 1 | Furnace 2 | Furnace 3 | IR furnace | Slow-cooling furnace | Furnace 1 | Furnace 2 | Furnace 3 | IR furnace | Slow-cooling furnace |
| SYN. EX. 4 | 150 | 300 | 450 | 570 | 520 460 410 350 290 240 | −4.3 | 0 | 4.3 | 0 | 0 |
| | 25 | 25 | 20 | 20 | 60 | | | | | |

TABLE 4-continued

| | Atmospheric temperature (upper column: temperature (° C.), lower column: retention time (sec)) | | | | | Expansion/contraction ratio (%) | | | | |
|---|---|---|---|---|---|---|---|---|---|---|
| | Furnace 1 | Furnace 2 | Furnace 3 | IR furnace | Slow-cooling furnace | Furnace 1 | Furnace 2 | Furnace 3 | IR furnace | Slow-cooling furnace |
| SYN. EX. 6 | 300 | 400 | 450 | 570 | 520  460<br>410  350<br>290  240 | 0 | 0 | 0 | 0 | 0 |
| | 25 | 25 | 20 | 20 | 60 | | | | | |

*SYN. EX.: SYNTHETIC EXAMPLE

The observed dimensional changes in EXAMPLES 1 and 2 and COMPARATIVE EXAMPLE 1 are shown in Table 5.

TABLE 5

| | | After etching (%) | | | After heating (%) | | Cumulative value (after etching + after heating) | | |
|---|---|---|---|---|---|---|---|---|---|
| | Position measured | MD | TD | Difference between MD and TD | MD | TD | MD | TD | Difference between MD and TD |
| EXAMPLE 1 | A | −0.13 | 0.00 | 0.13 | −0.12 | 0.15 | −0.25 | 0.15 | 0.40 |
| | B | −0.15 | 0.01 | 0.16 | −0.12 | 0.19 | −0.27 | 0.20 | 0.47 |
| | C | −0.11 | 0.04 | 0.15 | −0.09 | 0.20 | −0.20 | 0.24 | 0.44 |
| EXAMPLE 2 | A | −0.08 | −0.06 | 0.02 | −0.07 | 0.15 | −0.15 | 0.09 | 0.24 |
| | B | −0.06 | −0.03 | 0.03 | −0.08 | 0.17 | −0.15 | 0.14 | 0.25 |
| | C | −0.03 | −0.05 | 0.02 | −0.07 | 0.19 | −0.10 | 0.14 | 0.24 |
| COMP. EX. 1 | A | −0.27 | 0.26 | 0.53 | −0.18 | 0.19 | −0.45 | 0.45 | 0.90 |
| | B | −0.27 | 0.27 | 0.54 | −0.19 | 0.18 | −0.46 | 0.43 | 0.89 |
| | C | −0.25 | 0.26 | 0.51 | −0.20 | 0.18 | −0.45 | 0.44 | 0.89 |

*COMP. EX.: COMPARATIVE EXAMPLE

The observed coefficient of linear expansion of EXAMPLES 3 and 4 and COMPARATIVE EXAMPLE 2 are shown in Table 6.

TABLE 6

| | Coefficient of linear expansion | | Ratio of coefficient of linear expansion MD/TD |
|---|---|---|---|
| | MD | TD | |
| | ppm/° C. | | |
| EXAMPLE 3 | 20.1 | 22.4 | 0.90 |
| EXAMPLE 4 | 19.4 | 24.1 | 0.80 |
| COMP. EX. 2 | 22.0 | 20.1 | 1.09 |

*COMP. EX.: COMPARATIVE EXAMPLE

The observed dimensional changes in EXAMPLES 3 and 4 and COMPARATIVE EXAMPLE 2 are shown in Table 7.

TABLE 7

| | | After etching (%) | | | After heating (%) | | Cumulative value (after etching + after heating) | | |
|---|---|---|---|---|---|---|---|---|---|
| | Position measured | MD | TD | Difference between MD and TD | MD | TD | MD | TD | Difference between MD and TD |
| EXAMPLE 3 | A | −0.01 | 0.03 | 0.04 | −0.09 | 0.07 | −0.10 | 0.10 | 0.20 |
| | B | −0.02 | 0.01 | 0.03 | −0.11 | 0.06 | −0.13 | 0.07 | 0.20 |
| | C | −0.02 | 0.03 | 0.05 | −0.11 | 0.06 | −0.13 | 0.09 | 0.22 |

TABLE 7-continued

|  | Position measured | After etching (%) | | | After heating (%) | | Cumulative value (after etching + after heating) | | |
| --- | --- | --- | --- | --- | --- | --- | --- | --- | --- |
|  |  | MD | TD | Difference between MD and TD | MD | TD | MD | TD | Difference between MD and TD |
| EXAMPLE 4 | A | −0.03 | −0.04 | 0.01 | −0.10 | 0.06 | −0.13 | 0.02 | 0.15 |
|  | B | −0.03 | −0.03 | 0.00 | −0.09 | 0.05 | −0.12 | 0.02 | 0.14 |
|  | C | −0.03 | −0.04 | 0.01 | −0.09 | 0.07 | −0.12 | 0.03 | 0.15 |
| COMP. EX. 2 | A | −0.05 | 0.05 | 0.10 | −0.12 | 0.11 | −0.17 | 0.16 | 0.33 |
|  | B | −0.06 | 0.06 | 0.12 | −0.13 | 0.09 | −0.19 | 0.15 | 0.34 |
|  | C | −0.06 | 0.05 | 0.11 | −0.12 | 0.11 | −0.16 | 0.18 | 0.24 |

*COMP. EX.: COMPARATIVE EXAMPLE

COMPARATIVE EXAMPLE 1 shows that when the properties of the adhesive film are beyond predetermined ranges, the dimensional changes of the flexible metal-clad laminate increase. In contrast, the flexible metal-clad laminates of EXAMPLES 1 to 4 having properties controlled in predetermined ranges have smaller dimensional changes.

Example 5

The polyamic acid solution obtained in SYNTHETIC EXAMPLE 15 was diluted with DMF until the solid component content was 10 wt %. The polyamic acid was applied onto both surfaces of the polyimide film prepared in SYNTHETIC EXAMPLE 8 so that the final thickness of the thermoplastic polyimide layer (adhesive layer) was 4 µm on each surface. The film was then heated at 140° C. for 1 minute and passed through a far-infrared heating furnace at an atmospheric temperature of 390° C. for 20 seconds to form a thermally imidized adhesive film. The adhesive film, 18-µm rolled copper foils (BHY-22B-T, produced by Japan Energy Corporation) on both surfaces of the adhesive film, and protective materials (Apical 125NPI produced by Kaneka Corporation) on both surfaces of the copper foils were thermally laminated with a polyimide film tension of 0.4 N/cm, a lamination temperature of 360° C., a lamination pressure of 196 N/cm (20 kgf/cm), and a lamination speed of 1.5 m/min to prepare a flexible metal-clad laminate.

Example 6

An adhesive film and a flexible metal-clad laminate were prepared as in EXAMPLE 5 except that the polyimide film prepared in SYNTHETIC EXAMPLE 9 was used instead of the polyimide film prepared in SYNTHETIC EXAMPLE 8.

Example 7

An adhesive film and a flexible metal-clad laminate were prepared as in EXAMPLE 5 except that the polyimide film prepared in SYNTHETIC EXAMPLE 10 was used instead of the polyimide film prepared in SYNTHETIC EXAMPLE 8.

Example 8

An adhesive film and a flexible metal-clad laminate were prepared as in EXAMPLE 5 except that the polyimide film prepared in SYNTHETIC EXAMPLE 12 was used instead of the polyimide film prepared in SYNTHETIC EXAMPLE 8.

Example 9

An adhesive film and a flexible metal-clad laminate were prepared as in EXAMPLE 5 except that the polyimide film prepared in SYNTHETIC EXAMPLE 14 was used instead of the polyimide film prepared in SYNTHETIC EXAMPLE 8.

Comparative Example 3

An adhesive film and a flexible metal-clad laminate were prepared as in EXAMPLE 5 except that the polyimide film prepared in SYNTHETIC EXAMPLE 11 was used instead of the polyimide film prepared in SYNTHETIC EXAMPLE 8.

Reference Example

An adhesive film and a flexible metal-clad laminate were prepared as in EXAMPLE 5 except that the polyimide film prepared in SYNTHETIC EXAMPLE 13 was used instead of the polyimide film prepared in SYNTHETIC EXAMPLE 8.

The elastic modulus of the adhesive films of the EXAMPLES, COMPARATIVE EXAMPLE, and REFERENCE EXAMPLE are shown in Table 11.

The results of the evaluation of the flexible metal-clad laminates are shown in Table 12. The method of preparing samples of the adhesive films and the flexible metal-clad laminates are shown in FIG. 4.

The conditions of the production of SYNTHETIC EXAMPLES 8, 9, and 11 are shown in Table 8.

TABLE 8

| | Expansion/contraction ratio (%) | | | | Atmospheric temperature (° C.) | | | | Slow-cooling furnace | | |
|---|---|---|---|---|---|---|---|---|---|---|---|
| | Hot-air furnace | | | IR furnace | Furnace 1 | Furnace 2 | Furnace 3 | IR furnace | | | |
| | Furnace 1 | Furnace 2 | Furnace 3 | | | | | | | | |
| SYN. EX. 8 | -4.4 | 0.0 | 4.4 | 0.0 | 150 | 300 | 450 | 570 | 520 350 | 460 290 | 410 240 |
| SYN. EX. 9 | -4.4 | 0.0 | 2.2 | 0.0 | 180 | 300 | 450 | 570 | 520 350 | 460 290 | 410 240 |
| SYN. EX. 11 | 0.0 | 0.0 | 0.0 | 0.0 | 350 | 400 | 450 | 570 | 520 350 | 460 290 | 410 240 |
| Retention time (sec) | | | | | 25 | 25 | 20 | 20 | 50 | | |

*SYN. EX.: SYNTHETIC EXAMPLE

The conditions of the production of SYNTHETIC EXAMPLES 10 and 13 are shown in Table 9.

TABLE 9

| | Expansion/contraction ratio (%) | | | | Atmospheric temperature (° C.) | | | | Slow-cooling furnace | | |
|---|---|---|---|---|---|---|---|---|---|---|---|
| | Hot-air furnace | | | IR furnace | Furnace 1 | Furnace 2 | Furnace 3 | IR furnace | | | |
| | Furnace 1 | Furnace 2 | Furnace 3 | | | | | | | | |
| SYN. EX. 10 | -5.0 | 0.0 | 0.0 | 0.0 | 200 | 330 | 450 | 570 | 520 350 | 460 290 | 410 240 |
| SYN. Ex. 13 | -15.0 | 0.0 | 0.0 | 0.0 | 200 | 330 | 450 | 570 | 520 350 | 460 290 | 410 240 |
| Retention time (sec) | | | | | 60 | 60 | 30 | 40 | 80 | | |

*SYN. EX.: SYNTHETIC EXAMPLE

The conditions of the production of SYNTHETIC EXAMPLES 12 and 14 are shown in Table 10.

TABLE 10

| | Atmospheric temperature (° C.) | | | | Slow-cooling furnace | | | | Post-treatment temperature (° C.) | Post-treatment tension (kg/m) | Post-treatment tension (kg/mm²) |
|---|---|---|---|---|---|---|---|---|---|---|---|
| | Furnace 1 | Furnace 2 | Furnace 3 | IR furnace | | | | | | | |
| SYN. EX. 12 | 350 | 400 | 450 | 410 | 410 | 350 | 290 | 240 | 500 | 8 | 0.43 |
| SYN. EX. 14 | 350 | 400 | 450 | 410 | 410 | 350 | 290 | 240 | 500 | 12.5 | 0.73 |
| Retention time (sec) | 25 | 25 | 20 | 20 | 60 | | | | 30 | | |

*SYN. EX.: SYNTHETIC EXAMPLE

The observed elastic modulus of the adhesive films of EXAMPLES 5 to 9, COMPARATIVE EXAMPLE 3, and REFERENCE EXAMPLE are shown in Table 11.

TABLE 11

| SYN. EX. for Polyimide film | SYN. EX. for Adhesive | Elastic modulus (GPa) MD | TD | Ratio of elastic modulus MD/TD |
|---|---|---|---|---|
| EXAMPLE 5 | SYN. EX. 8 | SYN. EX. 15 | 5.57 | 5.31 | 1.05 |
| EXAMPLE 6 | SYN. EX. 9 | SYN. EX. 15 | 5.60 | 5.07 | 1.10 |
| EXAMPLE 7 | SYN. EX. 10 | SYN. EX. 15 | 5.84 | 4.86 | 1.20 |
| EXAMPLE 8 | SYN. EX. 12 | SYN. EX. 15 | 5.90 | 4.79 | 1.23 |
| EXAMPLE 9 | SYN. EX. 14 | SYN. EX. 15 | 5.27 | 3.12 | 1.69 |
| COMP. EX. 3 | SYN. EX. 11 | SYN. EX. 15 | 5.40 | 5.43 | 0.99 |
| REFERENCE EXAMPLE | SYN. EX. 13 | SYN. EX. 15 | 7.52 | 3.51 | 2.14 |

*SYN. EX.: SYNTHETIC EXAMPLE, COMP. EX.: COMPARATIVE EXAMPLE

The observed dimensional changes of the adhesive films of EXAMPLES 5 to 9, COMPARATIVE EXAMPLE 3, and REFERENCE EXAMPLE are shown in Table 12.

TABLE 12

| | SYN. EX. for Polyimide film | SYN. EX. for Adhesive | Position measured | Ratio of dimensional change(%) After etching MD | TD | After heating MD | TD | Cumulative value MD | TD | Difference between MD and TD |
|---|---|---|---|---|---|---|---|---|---|---|
| EXAMPLE 5 | SYN. EX. 8 | SYN. EX. 15 | A | −0.03 | −0.03 | −0.09 | 0.06 | −0.12 | 0.02 | 0.14 |
| | | | B | −0.03 | −0.04 | −0.07 | 0.05 | −0.10 | 0.01 | 0.11 |
| | | | C | −0.04 | −0.04 | −0.08 | 0.05 | −0.12 | 0.01 | 0.13 |
| | | | D | −0.03 | −0.02 | −0.07 | 0.04 | −0.10 | 0.02 | 0.12 |
| | | | E | −0.02 | −0.04 | −0.07 | 0.05 | −0.09 | 0.01 | 0.10 |
| | | | F | −0.03 | −0.03 | −0.08 | 0.06 | −0.11 | 0.02 | 0.13 |
| | | | G | −0.03 | −0.03 | −0.07 | 0.04 | 0.10 | 0.01 | 0.11 |
| | | | H | −0.04 | −0.03 | −0.09 | 0.06 | −0.13 | 0.03 | 0.16 |
| | | | I | −0.03 | −0.02 | −0.07 | 0.05 | −0.10 | 0.03 | 0.13 |
| EXAMPLE 6 | SYN. EX. 9 | SYN. EX. 15 | A | −0.02 | −0.08 | −0.08 | 0.04 | −0.10 | −0.02 | 0.08 |
| | | | B | −0.02 | −0.05 | −0.08 | 0.05 | −0.10 | 0.00 | 0.10 |
| | | | C | −0.03 | −0.05 | −0.09 | 0.04 | −0.12 | −0.01 | 0.11 |
| | | | D | −0.02 | −0.05 | −0.09 | 0.03 | −0.11 | −0.02 | 0.09 |
| | | | E | −0.02 | −0.05 | −0.08 | 0.05 | −0.10 | 0.00 | 0.10 |
| | | | F | −0.02 | −0.06 | −0.07 | 0.03 | −0.09 | −0.03 | 0.06 |
| | | | G | −0.03 | −0.06 | −0.03 | 0.06 | −0.11 | 0.00 | 0.11 |
| | | | H | −0.02 | −0.06 | −0.08 | 0.04 | −0.10 | −0.01 | 0.09 |
| | | | I | −0.03 | −0.07 | −0.07 | 0.04 | −0.10 | −0.03 | 0.07 |
| EXAMPLE 7 | SYN. EX. 10 | SYN. EX. 15 | A | 0.03 | −0.08 | −0.07 | 0.04 | −0.04 | −0.02 | 0.02 |
| | | | B | 0.02 | −0.05 | −0.05 | 0.03 | −0.04 | −0.02 | 0.02 |
| | | | C | 0.02 | −0.05 | −0.06 | 0.04 | −0.04 | −0.01 | 0.03 |
| | | | D | 0.02 | −0.05 | −0.08 | 0.04 | −0.04 | −0.01 | 0.03 |
| | | | E | 0.02 | −0.05 | −0.07 | 0.04 | −0.05 | −0.01 | 0.04 |
| | | | F | 0.02 | −0.08 | −0.05 | 0.03 | −0.03 | −0.03 | 0.00 |
| | | | G | 0.03 | −0.06 | −0.07 | 0.03 | −0.04 | −0.03 | 0.01 |
| | | | H | 0.03 | −0.04 | −0.06 | 0.03 | −0.03 | −0.01 | 0.02 |
| | | | I | 0.02 | −0.06 | −0.06 | 0.03 | −0.04 | −0.01 | 0.03 |
| EXAMPLE 8 | SYN. EX. 12 | SYN. EX. 15 | A | −0.04 | −0.02 | −0.09 | 0.04 | −0.13 | 0.02 | 0.15 |
| | | | B | −0.03 | −0.02 | −0.10 | 0.02 | −0.13 | 0.00 | 0.13 |
| | | | C | −0.05 | −0.01 | −0.08 | 0.04 | −0.13 | 0.03 | 0.16 |
| | | | D | −0.03 | −0.01 | −0.09 | 0.03 | −0.12 | 0.02 | 0.14 |
| | | | E | −0.03 | 0.00 | −0.08 | 0.03 | −0.12 | 0.03 | 0.15 |
| | | | F | −0.04 | −0.02 | −0.08 | 0.03 | −0.12 | 0.01 | 0.13 |
| | | | G | −0.03 | 0.00 | −0.07 | 0.04 | −0.10 | 0.04 | 0.14 |
| | | | H | −0.05 | −0.02 | −0.10 | 0.02 | −0.15 | 0.00 | 0.15 |
| | | | I | −0.04 | −0.02 | −0.08 | 0.03 | −0.12 | 0.01 | 0.13 |
| EXAMPLE 9 | SYN. EX. 14 | SYN. EX. 15 | A | −0.02 | −0.05 | −0.08 | 0.14 | −0.10 | 0.09 | 0.19 |
| | | | B | 0.00 | −0.04 | −0.07 | 0.15 | −0.07 | 0.11 | 0.18 |
| | | | C | −0.02 | −0.05 | −0.07 | 0.15 | −0.09 | 0.10 | 0.19 |
| | | | D | −0.01 | −0.03 | −0.07 | 0.12 | −0.08 | 0.09 | 0.17 |
| | | | E | 0.00 | −0.04 | −0.08 | 0.14 | −0.08 | 0.10 | 0.18 |
| | | | F | −0.03 | −0.06 | −0.09 | 0.13 | −0.12 | 0.07 | 0.19 |
| | | | G | 0.00 | −0.04 | −0.08 | 0.14 | −0.08 | 0.10 | 0.18 |
| | | | H | −0.02 | −0.04 | −0.06 | 0.14 | −0.08 | 0.10 | 0.18 |
| | | | I | −0.03 | −0.04 | −0.06 | 0.13 | −0.09 | 0.09 | 0.18 |
| COMP. EX. 3 | SYN. EX. 11 | SYN. EX. 15 | A | −0.07 | −0.01 | −0.10 | 0.05 | −0.17 | 0.04 | 0.21 |
| | | | B | −0.07 | −0.02 | −0.11 | 0.06 | −0.18 | 0.04 | 0.22 |
| | | | C | −0.08 | −0.02 | −0.11 | 0.05 | −0.19 | 0.03 | 0.22 |

TABLE 12-continued

| SYN. EX. for Polyimide film | SYN. EX. for Adhesive | Position measured | Ratio of dimensional change(%) | | | | | | |
|---|---|---|---|---|---|---|---|---|---|
| | | | After etching | | After heating | | Cumulative value | | Difference between |
| | | | MD | TD | MD | TD | MD | TD | MD and TD |
| | | D | −0.09 | 0.00 | 0.10 | 0.06 | −0.19 | 0.06 | 0.25 |
| | | E | −0.08 | −0.01 | 0.10 | 0.07 | −0.18 | 0.06 | 0.24 |
| | | F | −0.08 | −0.02 | −0.10 | 0.05 | −0.18 | 0.03 | 0.21 |
| | | G | −0.09 | −0.02 | 0.12 | 0.05 | −0.21 | 0.03 | 0.24 |
| | | H | −0.07 | 0.00 | −0.11 | 0.06 | 0.15 | 0.06 | 0.24 |
| | | I | −0.09 | −0.02 | −0.11 | 0.00 | −0.20 | 0.03 | 0.23 |
| REF. EX. | SYN. EX. 13 | SYN. EX. 15 | A | 0.01 | −0.30 | −0.05 | 0.00 | −0.04 | −0.30 | 0.26 |
| | | B | 0.02 | −0.30 | −0.04 | 0.01 | −0.02 | −0.29 | 0.27 |
| | | C | 0.02 | −0.31 | −0.05 | 0.00 | −0.03 | −0.31 | 0.28 |
| | | D | 0.01 | −0.29 | −0.04 | −0.01 | −0.03 | −0.30 | 0.27 |
| | | E | 0.01 | −0.29 | −0.05 | −0.02 | −0.04 | −0.31 | 0.27 |
| | | F | 0.00 | −0.28 | −0.04 | 0.00 | −0.04 | −0.28 | 0.24 |
| | | G | 0.02 | −0.30 | −0.05 | 0.02 | −0.03 | −0.28 | 0.25 |
| | | H | 0.01 | −0.30 | −0.05 | 0.00 | −0.04 | −0.30 | 0.26 |
| | | I | 0.01 | −0.31 | −0.06 | 0.01 | −0.05 | −0.30 | 0.25 |

*COMP. EX.: COMPARATIVE EXAMPLE REF. EX.: REFERENCE EXAMPLE SYN. EX.: SYNTHETIC EXAMPLE

As shown in COMPARATIVE EXAMPLE 3, when the properties of the adhesive film are beyond predetermined ranges, the dimensional change of the flexible metal-clad laminate increases. In EXAMPLES 5 to 9, in which the properties of the adhesive films are within the predetermined ranges, and the dimensional changes of the flexible metal-clad laminates are suppressed.

Example 10

The polyamic acid solution obtained in SYNTHETIC EXAMPLE 21 was diluted with DMF until the solid component content was 10 wt %. The polyamic acid was applied onto both surfaces of the polyimide film prepared in SYNTHETIC EXAMPLE 16 (film width: 1,000 mm) so that the final thickness of the thermoplastic polyimide layer (adhesive layer) was 4 μm on each surface. The film was then heated at 140° C. for 1 minute and passed through a far-infrared heating furnace at an atmospheric temperature of 390° C. for 20 seconds while applying a tension of 5 kg/m to form a thermally imidized adhesive film.

The adhesive film, 18-μm rolled copper foils (BHY-22B-T, produced by Japan Energy Corporation) on both surfaces of the adhesive film, and protective materials (Apical 12SNPI produced by Kaneka Corporation) on both surfaces of the copper foils were thermally laminated with a hot roll laminator at a polyimide film tension of 0.4 N/cm, a lamination temperature of 360° C., a lamination pressure of 196 N/cm (20 kgf/cm), and a lamination speed of 1.5 m/min to prepare a flexible metal-clad laminate of the present invention.

Example 11

An adhesive film and a flexible metal-clad laminate were prepared as in EXAMPLE 10 except that the polyimide film prepared in SYNTHETIC EXAMPLE 17 was used instead of the polyimide film prepared in SYNTHETIC EXAMPLE 16.

Example 12

An adhesive film and a flexible metal-clad laminate were prepared as in EXAMPLE 10 except that the polyimide film prepared in SYNTHETIC EXAMPLE 18 was used instead of the polyimide film prepared in SYNTHETIC EXAMPLE 16.

Comparative Example 4

An adhesive film and a flexible metal-clad laminate were prepared as in EXAMPLE 10 except that the polyimide film prepared in SYNTHETIC EXAMPLE 19 was used instead of the polyimide film prepared in SYNTHETIC EXAMPLE 16.

Reference Example

An adhesive film and a flexible metal-clad laminate were prepared as in EXAMPLE 10 except that the polyimide film prepared in SYNTHETIC EXAMPLE 20 was used instead of the polyimide film prepared in SYNTHETIC EXAMPLE 16.

The properties of the flexible metal-clad laminates prepared from the adhesive films of EXAMPLES and COMPARATIVE EXAMPLES were evaluated. The results are shown in Tables 14 and 15. The evaluation (sampling method) of the adhesive films and the flexible metal-clad laminates is shown in FIG. 5.

The conditions of heating and stretching in SYNTHETIC EXAMPLES 16 to 20 are shown in Table 13.

TABLE 13

| | Conditions of heating and stretching | | | |
|---|---|---|---|---|
| | Temperature | Retention time | Tension | |
| | ° C. | sec | kg/m | kg/mm$^2$ |
| SYN. EX. 16 | 460 | 45 | 8.0 | 0.32 |
| SYN. EX. 17 | 510 | 45 | 8.0 | 0.32 |
| SYN. EX. 18 | 510 | 45 | 12.7 | 0.51 |
| SYN. EX. 20 | — | — | — | — |
| SYN. EX. 19 | 510 | 45 | 20.1 | 0.80 |

*SYN. EX.: SYNTHETIC EXAMPLE

The observed coefficient of linear expansion elastic modulus of the adhesive films of EXAMPLES 10 to 12, COMPARATIVE EXAMPLE 4, and REFERENCE EXAMPLE are shown in Table 14.

TABLE 14

|  | Elastic modulus | | Ratio of elastic modulus MD/TD |
|---|---|---|---|
|  | MD (GPa) | TD (GPa) | |
| EXAMPLE 10 | 4.10 | 3.50 | 1.17 |
| EXAMPLE 11 | 4.35 | 3.39 | 1.28 |
| EXAMPLE 12 | 4.71 | 3.18 | 1.48 |
| COMP. EX. 4 | 3.80 | 3.95 | 0.96 |
| REFERENCE EXAMPLE | 5.81 | 2.88 | 2.02 |

*COMP. EX.: COMPARATIVE EXAMPLE

The observed dimensional changes of EXAMPLES 10 to 12, COMPARATIVE EXAMPLE 4, and REFERENCE EXAMPLE are shown in Table 15.

TABLE 15

| | | Ratio of dimensional change | | | | | | | |
|---|---|---|---|---|---|---|---|---|---|
| | | After etching (%) | | | After heating (%) | | Cumulative value (after etching + after heating) | | |
| | Position measured | MD | TD | Difference between MD and TD | MD | TD | MD | TD | Difference between MD and TD |
| EXAMPLE 10 | A | −0.19 | 0.09 | 0.28 | −0.12 | 0.13 | −0.31 | 0.22 | 0.53 |
| | B | −0.20 | 0.08 | 0.28 | −0.12 | 0.12 | −0.32 | 0.20 | 0.52 |
| | C | −0.18 | 0.09 | 0.27 | −0.12 | 0.15 | −0.30 | 0.24 | 0.54 |
| | D | −0.18 | 0.08 | 0.26 | −0.11 | 0.14 | −0.29 | 0.22 | 0.51 |
| | E | −0.19 | 0.08 | 0.27 | −0.12 | 0.13 | −0.31 | 0.21 | 0.52 |
| | F | −0.19 | 0.09 | 0.28 | −0.12 | 0.14 | −0.31 | 0.23 | 0.54 |
| EXAMPLE 11 | A | −0.18 | 0.07 | 0.25 | −0.13 | 0.16 | −0.31 | 0.23 | 0.54 |
| | B | −0.17 | 0.06 | 0.23 | −0.11 | 0.16 | −0.28 | 0.22 | 0.50 |
| | C | −0.18 | 0.08 | 0.26 | −0.13 | 0.15 | −0.31 | 0.23 | 0.54 |
| | D | −0.17 | 0.06 | 0.23 | −0.13 | 0.15 | −0.30 | 0.21 | 0.51 |
| | E | −0.16 | 0.08 | 0.24 | −0.11 | 0.16 | −0.27 | 0.24 | 0.51 |
| | F | −0.18 | 0.06 | 0.24 | −0.11 | 0.15 | −0.29 | 0.21 | 0.50 |
| EXAMPLE 12 | A | −0.12 | 0.02 | 0.14 | −0.11 | 0.18 | −0.23 | 0.20 | 0.43 |
| | B | −0.10 | 0.04 | 0.14 | −0.10 | 0.15 | −0.20 | 0.19 | 0.39 |
| | C | −0.15 | 0.00 | 0.15 | −0.09 | 0.18 | −0.24 | 0.18 | 0.42 |
| | D | −0.13 | 0.00 | 0.13 | −0.10 | 0.15 | −0.23 | 0.15 | 0.38 |
| | E | −0.12 | 0.03 | 0.15 | −0.11 | 0.16 | −0.23 | 0.19 | 0.42 |
| | F | −0.12 | 0.02 | 0.14 | −0.08 | 0.17 | −0.20 | 0.19 | 0.39 |
| COMP. EX. 4 | A | −0.27 | 0.28 | 0.53 | −0.18 | 0.19 | −0.45 | 0.45 | 0.90 |
| | B | −0.27 | 0.27 | 0.54 | −0.19 | 0.16 | −0.46 | 0.43 | 0.89 |
| | C | −0.25 | 0.26 | 0.51 | −0.20 | 0.18 | −0.45 | 0.44 | 0.89 |
| | D | −0.25 | 0.27 | 0.52 | −0.19 | 0.17 | −0.44 | 0.44 | 0.88 |
| | E | −0.26 | 0.26 | 0.52 | −0.18 | 0.18 | −0.44 | 0.44 | 0.88 |
| | F | −0.27 | 0.26 | 0.53 | −0.19 | 0.17 | −0.46 | 0.43 | 0.89 |
| REFERENCE EXAMPLE | A | 0.59 | −0.48 | 1.07 | 0.11 | 0.15 | 0.70 | −0.33 | 1.03 |
| | B | 0.60 | −0.47 | 1.07 | 0.11 | 0.18 | 0.71 | −0.31 | 1.02 |
| | C | 0.60 | −0.47 | 1.07 | 0.10 | 0.14 | 0.70 | −0.33 | 1.03 |
| | D | 0.58 | −0.48 | 1.06 | 0.12 | 0.17 | 0.70 | −0.31 | 1.01 |
| | E | 0.61 | −0.49 | 1.10 | 0.13 | 0.15 | 0.74 | −0.34 | 1.08 |
| | F | 0.59 | −0.48 | 1.07 | 0.10 | 0.15 | 0.69 | −0.33 | 1.02 |

COMPARATIVE EXAMPLE 4 shows that when the properties of the adhesive film are beyond predetermined ranges, the dimensional changes of the flexible metal-clad laminate are increased. In contrast, the flexible metal-clad laminates of EXAMPLES 10 to 12 having properties controlled in predetermined ranges have smaller dimensional changes.

Figure 1:
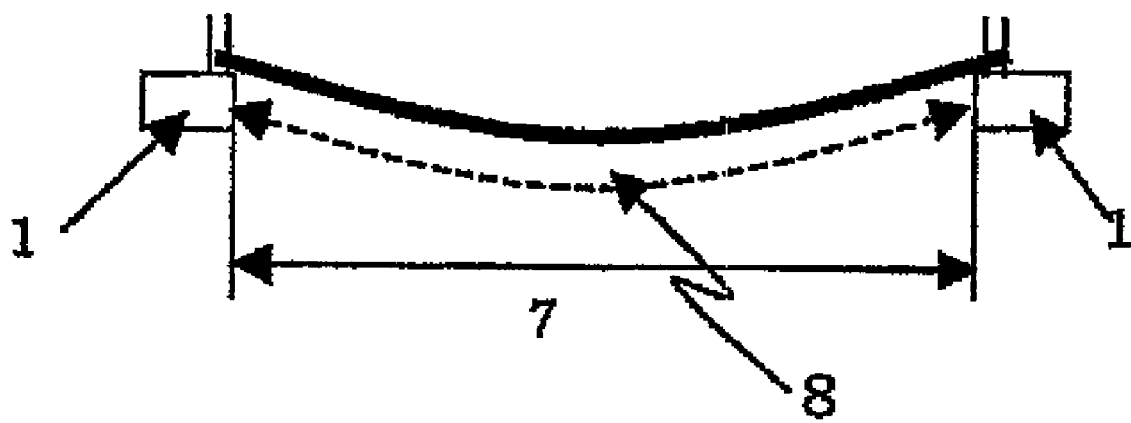
FIG. 1 is a cross-sectional view showing a film in a relaxed state.
Figure 2:
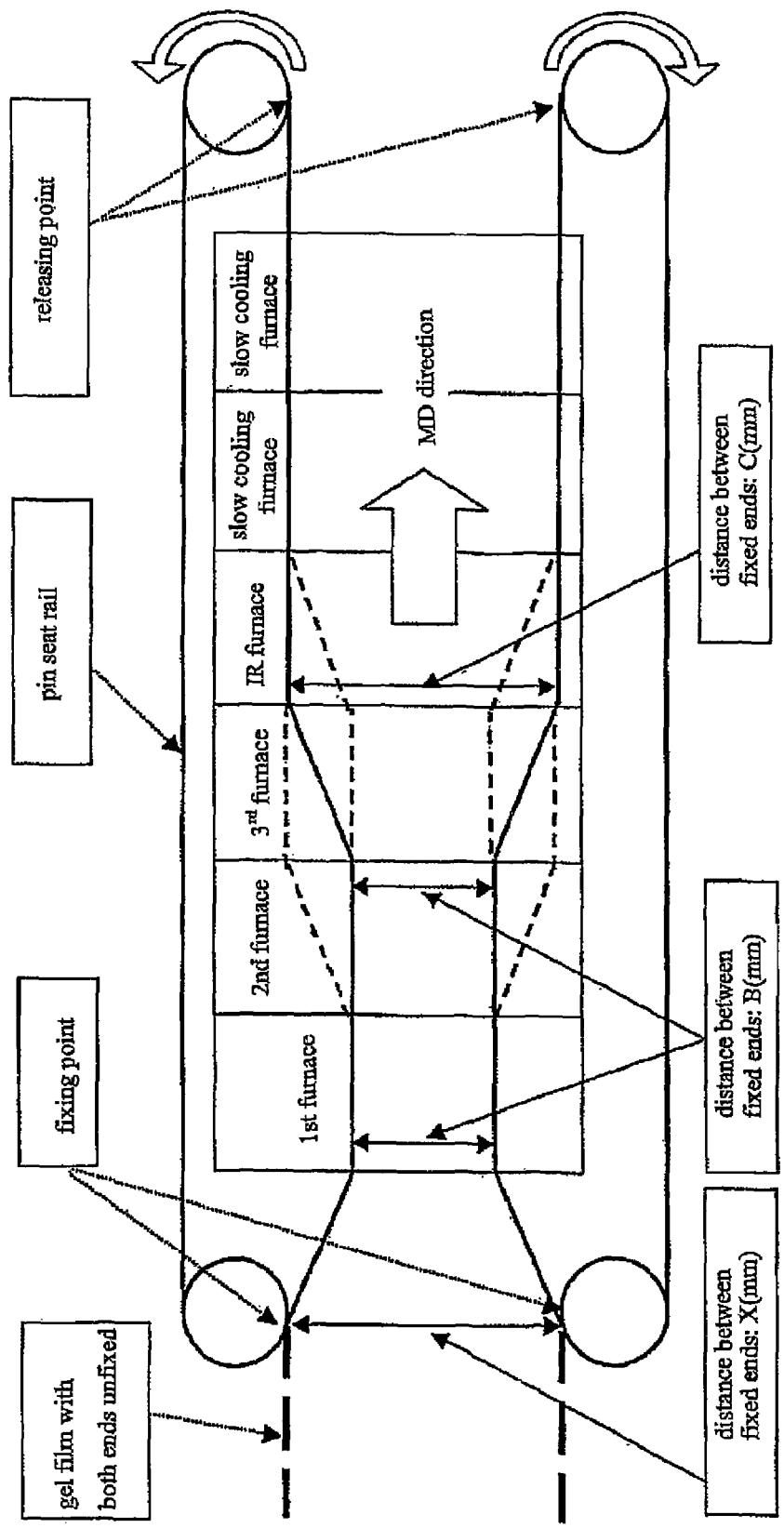
FIG. 2 is a schematic diagram showing a tenter furnace and expansion/contraction ratios.
Figure 3:
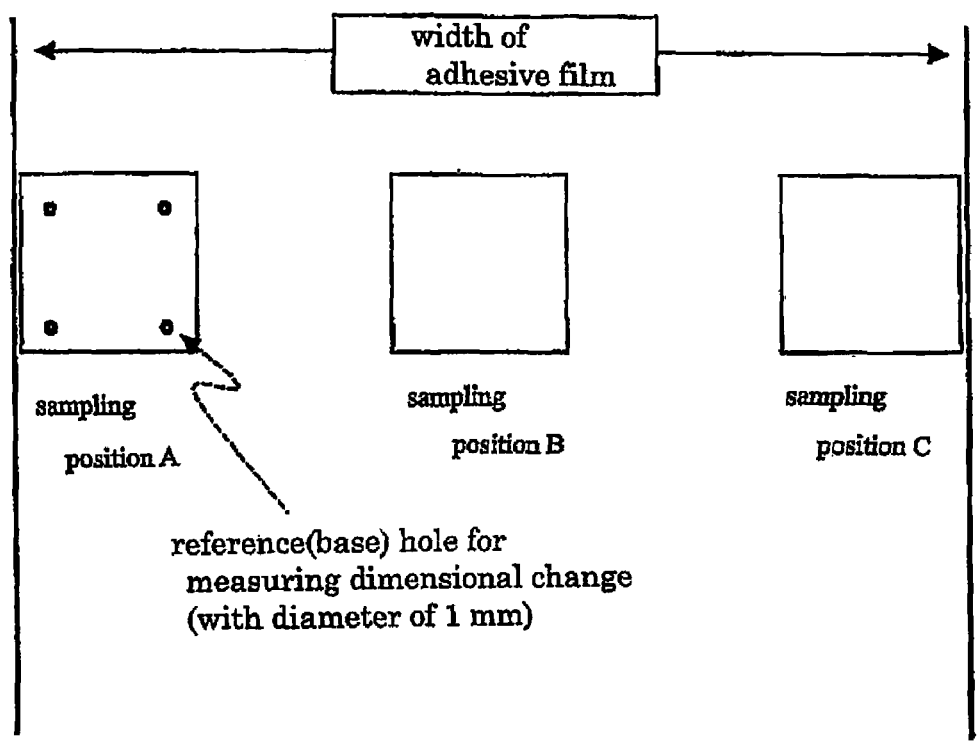
FIG. 3 is a diagram showing a sampling method for measuring dimensional changes.
Figure 4:
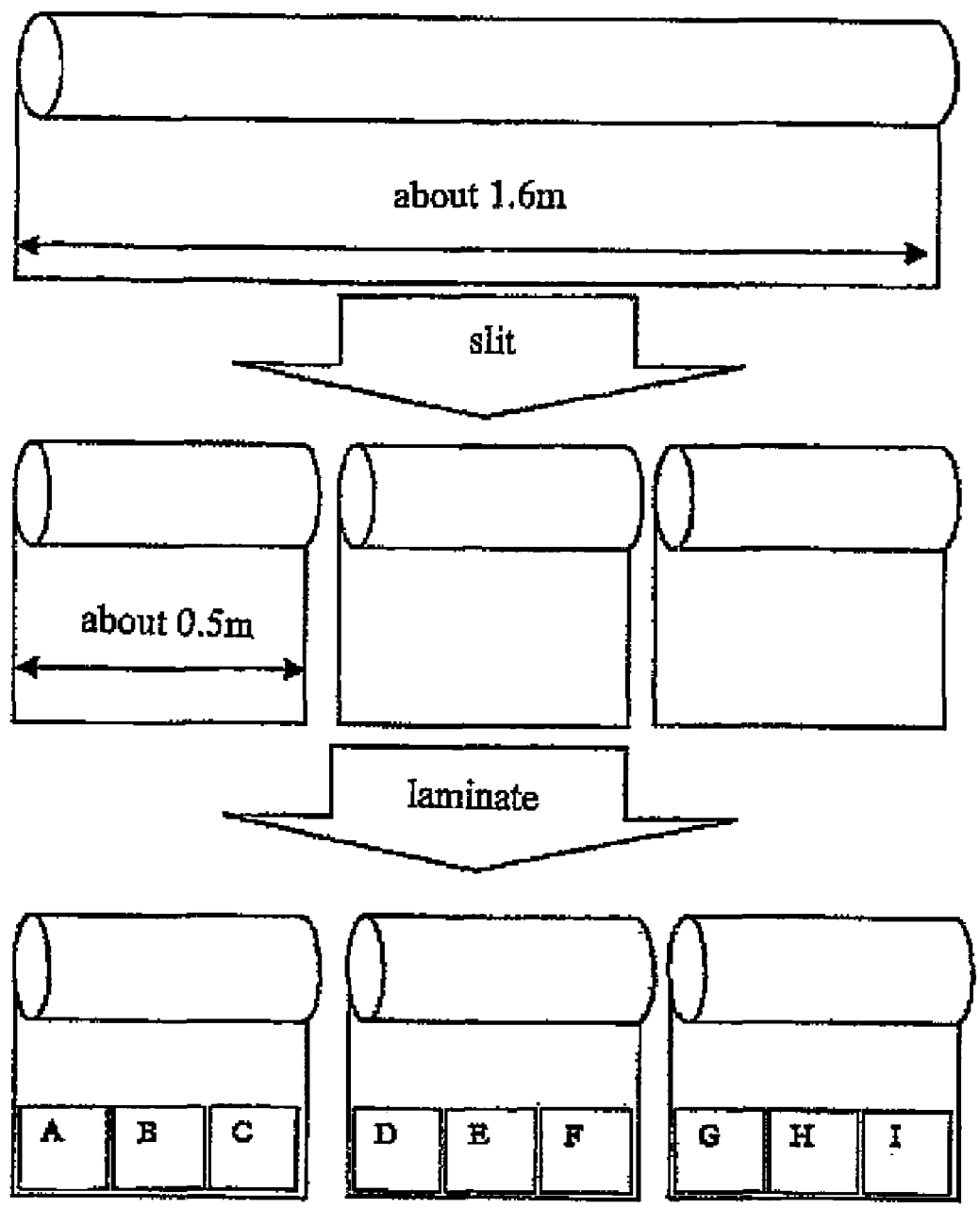
FIG. 4 is a diagram showing a sampling method for measuring dimensional changes.
Figure 5:
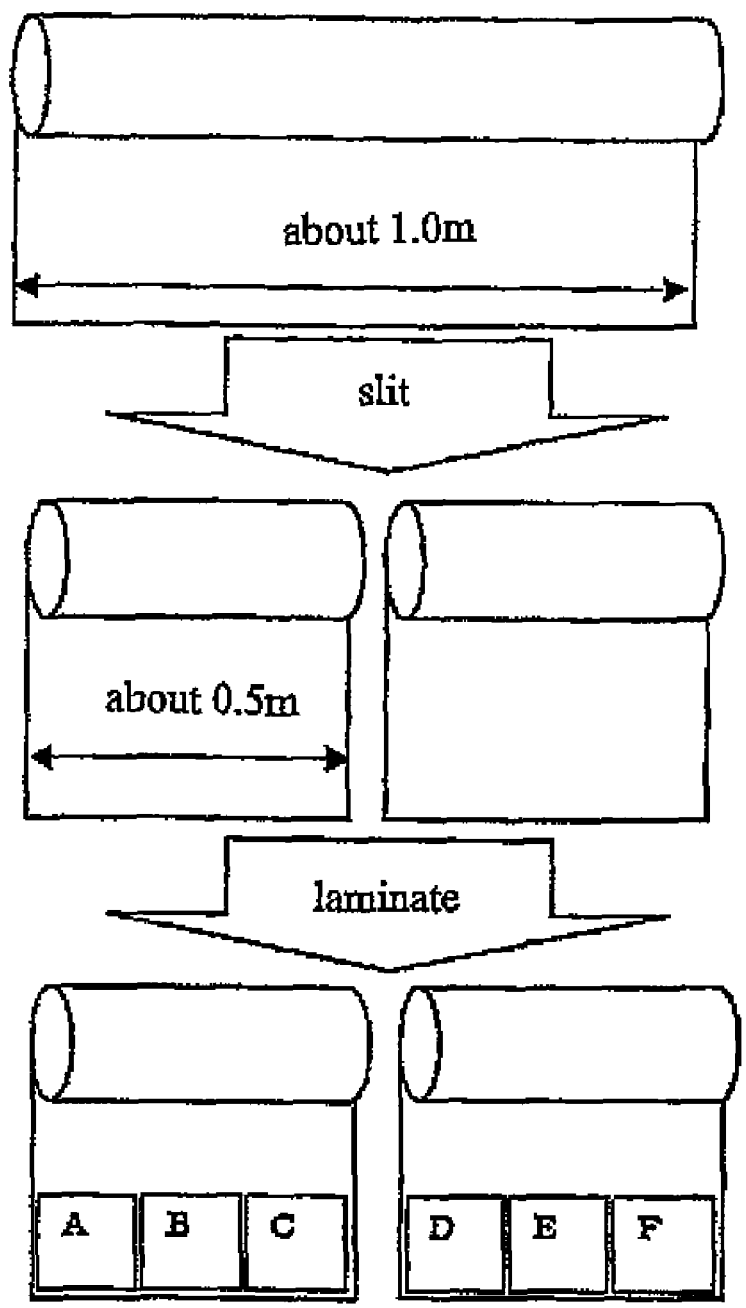
FIG. 5 is a diagram showing a sampling method for measuring dimensional changes.

The invention claimed is:

1. An adhesive film comprising:
   a polyimide film; and
   an adhesive layer containing a thermoplastic polyimide formed on at least one surface of the polyimide film,
   wherein a coefficient of linear expansion of the adhesive film satisfies the relationship:

$0.8 > $(coefficient of linear expansion in the $MD$ direction)/(coefficient of linear expansion in the $TD$ direction)$ > 0.1$ wherein the coefficient of linear expansion is an average value in the temperature range of 100° C. to 200° C.

2. An adhesive film comprising:
   a polyimide film; and
   an adhesive layer containing a thermoplastic polyimide formed on at least one surface of the polyimide film,
   wherein the adhesive film is produced by a continuous process and has a coefficient of linear expansion across the entire width of the adhesive film satisfying the relationship:

$0.8 > $(coefficient of linear expansion in the $MD$ direction)/(coefficient of linear expansion in the $TD$ direction)$ > 0.1$ wherein the coefficient of linear expansion is an average value in the temperature range of 100° C. to 200° C.

3. The adhesive film according to claim 2, wherein the adhesive film is a long film having a width of 250 mm or more.

4. The adhesive film according to claim 2, wherein a metal foil can be bonded in a continuous process onto the adhesive film under heating and pressure using at least one pair of metal rollers.

5. A flexible metal-clad laminate comprising:
the adhesive film according to claim 1; and
a metal foil bonded onto the adhesive film.

6. A method for making a flexible metal-clad laminate, comprising:
bonding a metal foil onto the adhesive film according to claim 1 by a continuous process under heating and pressure.

7. An adhesive film comprising:
a polyimide film; and
an adhesive layer containing a thermoplastic polyimide formed on at least one surface of the polyimide film,
wherein the adhesive film has an elastic modulus in the MD direction of 5 GPa or more and satisfies the relationship:

1.70>(elastic modulus in the $MD$ direction)/(elastic modulus in the $TD$ direction)>1.05.

8. An adhesive film comprising:
a polyimide film; and
an adhesive layer containing a thermoplastic polyimide formed on at least one surface of the polyimide film,
wherein the adhesive film is produced by a continuous process and satisfies the relationship:

1.70>(elastic modulus in the $MD$ direction)/(elastic modulus in the $TD$ direction)>1.05 when the elastic modulus of the adhesive film in the MD direction across the entire width is 5 GPa or more.

9. The adhesive film according to claim 8, wherein the adhesive film is a long film having a width of 250 mm or more.

10. The adhesive film according to claim 8, wherein the adhesive film is used in a continuous process of bonding a metal foil onto the adhesive film under heating and pressure using at least one pair of metal rollers.

11. A flexible metal-clad laminate comprising:
the adhesive film according to claim 7; and
a metal foil bonded onto the adhesive film.

12. A method for making a flexible metal-clad laminate, comprising:
bonding a metal foil onto the adhesive film according to claim 7 by a continuous process under heating and pressure.

13. An adhesive film comprising:
a polyimide film; and
an adhesive layer containing a thermoplastic polyimide formed on at least one surface of the polyimide film,
wherein the adhesive film has an elastic modulus in the MD direction of less than 5 GPa and satisfies the relationship:

2.00>(elastic modulus in the $MD$ direction)/(elastic modulus in the $TD$ direction)>1.10.

14. The adhesive film according to claim 13, wherein the adhesive film is a long film having a width of 250 mm or more.

15. The adhesive film according to claim 13, wherein the adhesive film is used in a continuous process of bonding a metal foil onto the adhesive film under heating and pressure using at least one pair of metal rollers.

16. An adhesive film comprising:
a polyimide film; and
an adhesive layer containing a thermoplastic polyimide formed on at least one surface of the polyimide film,
wherein the adhesive film is produced by a continuous process and satisfies the relationship:

2.00>(elastic modulus in the $MD$ direction)/(elastic modulus in the $TD$ direction)>1.10 when the elastic modulus of the adhesive film in the MD direction across the entire width is less than 5 GPa.

17. The adhesive film according to claim 16, wherein the adhesive film is a long film having a width of 250 mm or more.

18. The adhesive film according to claim 16, wherein the adhesive film is used in a continuous process of bonding a metal foil onto the adhesive film under heating and pressure using at least one pair of metal rollers.

19. A flexible metal-clad laminate comprising:
the adhesive film according to claim 13; and
a metal foil bonded onto the adhesive film.

20. A method for making a flexible metal-clad laminate, comprising:
bonding a metal foil onto the adhesive film according to claim 13 by a continuous process under heating.

* * * * *